(12) United States Patent
Zhang et al.

(10) Patent No.: US 11,721,287 B2
(45) Date of Patent: Aug. 8, 2023

(54) PHOTOELECTRIC DETECTION CIRCUIT AND DRIVING METHOD THEREOF, DISPLAY APPARATUS AND MANUFACTURING METHOD THEREOF

(71) Applicant: BOE TECHNOLOGY GROUP CO., LTD., Beijing (CN)

(72) Inventors: Zhenyu Zhang, Beijing (CN); Li Xiao, Beijing (CN); Dongni Liu, Beijing (CN); Liang Chen, Beijing (CN); Hao Chen, Beijing (CN); Haoliang Zheng, Beijing (CN); Minghua Xuan, Beijing (CN); Jiao Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,661

(22) PCT Filed: Aug. 18, 2021

(86) PCT No.: PCT/CN2021/113287
§ 371 (c)(1),
(2) Date: Jun. 28, 2022

(87) PCT Pub. No.: WO2022/052763
PCT Pub. Date: Mar. 17, 2022

(65) Prior Publication Data
US 2023/0032018 A1    Feb. 2, 2023

(30) Foreign Application Priority Data
Sep. 14, 2020 (CN) .......................... 202010964416.0

(51) Int. Cl.
*G09G 3/3258*    (2016.01)
*G06F 3/042*    (2006.01)
(Continued)

(52) U.S. Cl.
CPC ........... *G09G 3/3258* (2013.01); *G06F 3/042* (2013.01); *G06F 3/0421* (2013.01);
(Continued)

(58) Field of Classification Search
CPC ......... G09G 3/3258; G09G 2300/0439; G09G 2310/061; G09G 2320/0233;
(Continued)

(56) References Cited

U.S. PATENT DOCUMENTS 6,392,617 B1    5/2002   Gleason
2002/0047550 A1    4/2002   Tanada
(Continued)

FOREIGN PATENT DOCUMENTS

CN    105071797 A    11/2015
CN    106887212 A    6/2017
(Continued)

OTHER PUBLICATIONS

China Patent Office, CN202010964416.0 First Office Action dated Aug. 31, 2022.

*Primary Examiner* — Tom V Sheng
(74) *Attorney, Agent, or Firm* — Houtteman Law LLC

(57) ABSTRACT

Provided are a photoelectric detection circuit and a driving method thereof, a display apparatus and a manufacturing method thereof. The photoelectric detection circuit includes: a first reset sub-circuit, a second reset sub-circuit, a first storage sub-circuit, a data read sub-circuit and a photosensitive device. A first terminal of the data read sub-circuit, a first terminal of the first storage sub-circuit, a first electrode of the photosensitive device and a first terminal of the first reset sub-circuit are connected to a first node. A second electrode of the photosensitive device is connected to a common voltage line. The data read sub-circuit is configured to transmit a voltage of the first node to a data read line in
(Continued)

response to a signal of a scan line. The first reset sub-circuit is configured to reset the voltage of the first node.

20 Claims, 20 Drawing Sheets

(51) Int. Cl.
    *H04N 25/00* (2023.01)
    *H04N 25/40* (2023.01)
    *H04N 25/47* (2023.01)

(52) U.S. Cl.
    CPC ............ *G09G 2300/0439* (2013.01); *G09G 2310/061* (2013.01); *G09G 2320/0233* (2013.01); *G09G 2360/14* (2013.01); *G09G 2360/148* (2013.01); *H04N 25/00* (2023.01); *H04N 25/40* (2023.01); *H04N 25/47* (2023.01)

(58) Field of Classification Search
    CPC .......... G09G 2360/14; G09G 2360/148; G06F 3/042; G06F 3/0421; H04N 25/00; H04N 25/40; H04N 25/47
    USPC .......................................................... 345/204
    See application file for complete search history.

(56) References Cited

U.S. PATENT DOCUMENTS

| | | | | |
|---|---|---|---|---|
| 2002/0122128 A1* | 9/2002 | Yamaguchi | ............ | H04N 25/00 348/E3.018 |
| 2002/0122130 A1* | 9/2002 | Yamaguchi | ....... | H01L 27/14643 348/308 |
| 2006/0077169 A1 | 4/2006 | Fujikawa | | |
| 2009/0206378 A1* | 8/2009 | Kim | ...................... | G09G 3/3233 257/292 |
| 2009/0213095 A1* | 8/2009 | Harada | ................... | G06F 3/042 382/103 |
| 2009/0268065 A1* | 10/2009 | Fereyre | ................. | H04N 3/155 348/294 |
| 2010/0128004 A1* | 5/2010 | Harada | ................. | G06F 3/0412 348/311 |
| 2010/0271335 A1* | 10/2010 | Gotoh | ................... | G06F 3/0412 345/207 |
| 2011/0043471 A1* | 2/2011 | Senda | ..................... | G06F 3/042 345/173 |
| 2012/0176356 A1* | 7/2012 | Usukura | .............. | G09G 3/3406 345/207 |
| 2012/0268439 A1* | 10/2012 | Yamamoto | ............ | G06F 3/0421 345/207 |
| 2013/0050138 A1 | 2/2013 | Chan | | |
| 2013/0063407 A1* | 3/2013 | Usukura | ............... | G06F 3/0412 345/207 |
| 2013/0112886 A1 | 5/2013 | Shin | | |
| 2013/0113768 A1* | 5/2013 | Yamamoto | .............. | G06F 3/042 345/207 |
| 2013/0265616 A1* | 10/2013 | Okada | ................. | G06F 3/04184 358/406 |
| 2014/0022401 A1* | 1/2014 | Awatani | ............... | H04N 25/585 348/207.11 |
| 2015/0103037 A1* | 4/2015 | Wu | ....................... | G06F 3/0412 345/80 |
| 2015/0220201 A1* | 8/2015 | Wu | ..................... | G06F 3/04166 345/173 |
| 2015/0317932 A1* | 11/2015 | Zhou | ..................... | G06F 3/0412 345/173 |
| 2015/0319341 A1* | 11/2015 | Sekine | ...................... | G06T 7/20 348/64 |
| 2016/0042216 A1* | 2/2016 | Yang | .................. | G06F 3/04166 382/124 |
| 2016/0204165 A1* | 7/2016 | Yang | ................... | G06F 3/04184 345/174 |
| 2017/0365224 A1 | 12/2017 | Okamoto | | |
| 2018/0249109 A1 | 8/2018 | Yang et al. | | |
| 2019/0007637 A1* | 1/2019 | Nishikido | .............. | H04N 25/67 |
| 2019/0027499 A1* | 1/2019 | Li | ......................... | H01L 31/105 |
| 2020/0161493 A1* | 5/2020 | Lee | ...................... | H01L 27/124 |
| 2020/0212137 A1* | 7/2020 | Wang | ................. | H10K 59/1213 |
| 2020/0213536 A1 | 7/2020 | Wang et al. | | |
| 2021/0327353 A1* | 10/2021 | Liu | ...................... | G09G 3/3275 |
| 2021/0335249 A1* | 10/2021 | Zhang | .................. | G06F 3/0412 |

FOREIGN PATENT DOCUMENTS

| | | |
|---|---|---|
| CN | 107591425 A | 1/2018 |
| CN | 108280432 A | 7/2018 |
| CN | 108493214 A | 9/2018 |
| CN | 108493215 A | 9/2018 |
| CN | 108803932 A | 11/2018 |
| CN | 109244112 A | 1/2019 |
| CN | 109298804 A | 2/2019 |
| CN | 109599060 A | 4/2019 |
| CN | 110672202 A | 1/2020 |
| CN | 111028811 A | 4/2020 |
| CN | 111370458 A | 7/2020 |

* cited by examiner

PHOTOELECTRIC DETECTION CIRCUIT AND DRIVING METHOD THEREOF, DISPLAY APPARATUS AND MANUFACTURING METHOD THEREOF

TECHNICAL FIELD

The present disclosure relates to the field of display technology, and in particular, to a photoelectric detection circuit and a driving method thereof, and a display apparatus and a manufacturing method thereof.

BACKGROUND

An OLED (Organic Light Emitting Diode) is a display device driven by a current, and is widely used in display related fields due to its advantages of self-luminescence, fast response, wide viewing angle, and capability of being manufactured on a flexible base substrate.

SUMMARY

A photoelectric detection circuit and a driving method thereof, a display apparatus and a manufacturing method thereof are provided in the embodiments of the present disclosure.

In a first aspect, a photoelectric detection circuit is provided. The photoelectric detection circuit includes: a first reset sub-circuit, a second reset sub-circuit, a first storage sub-circuit, a data read sub-circuit and a photosensitive device, wherein a first terminal of the data read sub-circuit, a first terminal of the first storage sub-circuit, a first electrode of the photosensitive device and a first terminal of the first reset sub-circuit are connected to a first node; a second electrode of the photosensitive device is connected to a common voltage line; the photosensitive device is configured to generate an inductive electrical signal based on a sensed light signal; the data read sub-circuit is configured to transmit a voltage of the first node to a data read line in response to control of a signal of a scan line; the first reset sub-circuit is configured to reset the voltage of the first node in response to control of a signal of a reset line; the first storage sub-circuit is configured to store a voltage between the first node and the common voltage line; and the second reset sub-circuit is configured to reset a voltage of the scan line in response to control of the signal of the reset line.

In some embodiments, the photoelectric detection circuit further includes a second storage sub-circuit configured to store a voltage between the scan line and the common voltage line.

In some embodiments, the first reset sub-circuit includes a first reset transistor, and the first reset transistor has a gate electrode connected to the reset line, a first electrode connected to the common voltage line, and a second electrode forming the first terminal of the first reset sub-circuit; and the data read sub-circuit includes a data read transistor, and the data read transistor has a gate electrode connected to the scan line, a first electrode connected to the data read line, and a second electrode forming the first terminal of the data read sub-circuit.

In some embodiments, the data read line and the scan line are located in different layers insulated from and spaced apart from each other, the scan line extends in a first direction, the data read line extends in a second direction, and the first direction intersects with the second direction; and the gate electrode of the data read transistor is a part of the scan line, and orthographic projections of the first electrode and the second electrode of the data read transistor on a first base are respectively located on two sides, in the second direction, of an orthographic projection of the scan line on the first base.

In some embodiments, the first electrode and the second electrode of the first reset transistor, and the first electrode and the second electrode of the data read transistor each are located in the same layer as the data read line, and a first insulating layer is provided between a layer in which the first electrode of the first reset transistor is located and a layer in which the common voltage line is located, the first insulating layer is provided with a first via hole therein, the first via hole exposes a part of the common voltage line, and the first electrode of the first reset transistor is connected to the common voltage line through the first via hole.

In some embodiments, the second reset sub-circuit includes a second reset transistor, and the second reset transistor has a gate electrode connected to the reset line, a first electrode having a one-piece structure together with the first electrode of the first reset transistor, and a second electrode connected to the scan line.

In some embodiments, the first insulating layer is further provided with a second via hole therein, the second via hole exposes a part of the scan line, and the second electrode of the second reset transistor is connected to the scan line through the second via hole.

In some embodiments, the first storage sub-circuit includes a first capacitor having a first plate and a second plate, and the first plate of the first capacitor and the common voltage line have a one-piece structure; and the second plate of the first capacitor, the second electrode of the data read transistor, and the second electrode of the first reset transistor have a one-piece structure.

In some embodiments, the photosensitive device is located on a side of the second plate of the first capacitor away from the first plate of the first capacitor, a second insulating layer is provided between a layer in which a first electrode of the photosensitive device is located and a layer in which the second plate of the first capacitor is located, the second insulating layer is provided with a third via hole therein, the third via hole exposes a part of the second plate of the first capacitor, the first electrode of the photosensitive device is connected to the second plate of the first capacitor through the third via hole to form the first node; and second electrodes of photosensitive devices of a plurality of photoelectric detection circuits have a one-piece structure.

In some embodiments, an orthographic projection of the first electrode of the photosensitive device on a first base covers at least an orthographic projection of the first capacitor on the first base.

In some embodiments, the second storage sub-circuit includes a second capacitor, a first plate of the second capacitor is a part of the scan line, and a second plate of the second capacitor is a part of the first electrode of the first reset transistor.

In a second aspect, a display apparatus is provided. The display apparatus includes: a display substrate including: a second base and a plurality of pixel structures on the second base, each of the plurality of pixel structures including a light emitting device; and a photoelectric detection substrate including: a first base and a plurality of photoelectric detection circuits on the first base, each of the plurality of photoelectric detection circuits is the above photoelectric detection circuit, wherein the display substrate includes a display side and a non-display side opposite to each other, the photoelectric detection substrate is located on the non-display side of the display substrate, an orthographic projection of each of photosensitive devices on the second base is within an orthographic projection of y number of pixel structures on the second base to receive light emitted by y number of light emitting devices, $1 \leq y \leq 100$, and y is an integer.

In some embodiments, a material of the second base includes glass or polyimide.

In some embodiments, both an extending direction of the common voltage line and an extending direction of the reset line are the same as an extending direction of the scan line, and both the common voltage line and the reset line are located in the same layer as the scan line, and the scan line is located between the common voltage line and the reset line.

In some embodiments, each of the plurality of pixel structures further includes a pixel driving circuit, and the pixel driving circuit includes a driving transistor, a data writing transistor and a third capacitor; the data writing transistor has a gate electrode connected to a gate line, a first electrode connected to a data line, and a second electrode connected to a gate electrode of the driving transistor; the driving transistor has a first electrode connected to a first power line, and a second electrode connected to a first electrode of the light emitting device; and two terminals of the third capacitor are connected to the gate electrode and the first electrode of the driving transistor, respectively.

In some embodiments, a first plate of the third capacitor is at least a part of the gate electrode of the driving transistor, and a second plate of the third capacitor is located on a side of the first plate of the third electrode away from the second base.

In some embodiments, an active layer of the driving transistor, the first electrode of the driving transistor and the second electrode of the driving transistor are provided in the same layer; a first gate insulating layer is provided between a layer in which the gate electrode of the driving transistor is located and a layer in which the active layer of the driving transistor is located; a second gate insulating layer is provided between the layer in which the gate electrode of the driving transistor is located and a layer in which the second plate of the third capacitor is located; the first power line is located on a side of the layer, in which the second plate of the third capacitor is located, away from the second base; an interlayer dielectric layer is provided between a layer in which the first power line is located and the layer in which the second plate of the third capacitor is located; and the first power line is connected to the second plate of the third capacitor through a fourth via hole and is connected to the first electrode of the driving transistor through a fifth via hole, the fourth via hole penetrates through the interlayer dielectric layer and exposes a part of the second plate of the third capacitor; the fifth via hole penetrates through the interlayer dielectric layer, the second gate insulating layer and the first gate insulating layer, and exposes a part of the first electrode of the driving transistor.

In some embodiments, the second electrode of the data writing transistor and an active layer of the data writing transistor are provided in the same layer as the active layer of the driving transistor, each of the plurality of pixel structures further includes a bridge in the same layer as the first power line, one terminal of the bridge is connected to the gate electrode of the driving transistor through a sixth via hole, and the other terminal of the bridge is connected to the second electrode of the data writing transistor through a seventh via hole, and the sixth via hole penetrates through the interlayer dielectric layer and the second gate insulating layer, and exposes a part of the gate electrode of the driving transistor; the seventh via hole penetrates through the interlayer dielectric layer, the second gate insulating layer and the first gate insulating layer, and exposes a part of the second electrode of the data writing transistor.

In some embodiments, the data line is located on a side of the layer, in which the first power line is located, away from the second base; a passivation layer is provided between a layer in which the data line is located and the layer in which the first power line is located; the first electrode of the light emitting device is located on a side of the layer, in which the data line is located, away from the second base, and a planarization layer is provided between a layer in which the first electrode of the light emitting device is located and the layer in which the data line is located; each of the plurality of pixel structures further includes: a first adapter in the same layer as the bridge, wherein the first adapter is connected to the second electrode of the driving transistor through an eighth via hole, and the eighth via hole penetrates through the interlayer dielectric layer, the second gate insulating layer and the first gate insulating layer and exposes a part of the second electrode of the driving transistor; and a second adaptor in the same layer as the data line, wherein the second adaptor is connected to the first adaptor through a ninth via hole in the passivation layer, and the first electrode of the light emitting device is connected to the second adaptor through a tenth via hole penetrating through the planarization layer.

In some embodiments, an orthographic projection of the first electrode of the light emitting device on the second base overlaps with an orthographic projection of the data line on the second base.

In some embodiments, the plurality of pixel structures are arranged in multiple rows and multiple columns, and two adjacent pixel driving circuits in the same column are connected to two adjacent data lines, respectively; and pixel driving circuits in the same row is connected to the same first power line.

In some embodiments, a virtual structure obtained after a pixel driving circuit in a i-th row and j-th column is moved in a column direction is in mirror symmetry with a pixel driving circuit in a (i+1)th row and (j+2)th column, $1 \leq i \leq m-1$, $1 \leq j \leq n-2$, m is a total number of rows of the pixel driving circuits, and n is a total number of columns of the pixel driving circuits.

In some embodiments, the light emitting device further includes a light emitting layer on a side of the first electrode of the light emitting device away from the second base, and each of the plurality of pixel structures further includes a light passing portion between the light emitting layer and the second base, the light passing portion is used for passing light such that a part of light emitted by the light emitting layer is emitted toward the second base.

In some embodiments, the light passing portion includes a first light passing hole penetrating through the pixel driving circuit; or the light passing portion includes a light passing slit in the pixel driving circuit.

In some embodiments, the first electrode of the light emitting device is a reflective electrode, and the light passing portion further includes a second light passing hole penetrating through the first electrode of the light emitting device.

In some embodiments, the display apparatus further includes: a lens layer between the display substrate and the photoelectric detection substrate, the lens layer including a plurality of lenses for converging light.

In some embodiments, the display apparatus further includes: a compensation circuit connected to the data read line and configured to determine a compensation parameter of the light emitting device based on a difference between an actual voltage of the data read line and a theoretical voltage of the data read line; and a display driving circuit connected to the compensation circuit and a pixel structure, and configured to determine a driving signal for the light emitting device based on the compensation parameter of the light emitting device and a target brightness of the light emitting device and to output the driving signal to the pixel structure.

In a third aspect, a driving method for a photoelectric detection circuit is provided. The photoelectric detection circuit is the photoelectric detection circuit in the above embodiments. The driving method includes: in a reset stage, loading an effective level signal to the reset line and an ineffective level signal to the scan line, such that the voltage of the first node is reset by the first reset sub-circuit and the voltage of the scan line is reset by the second reset sub-circuit; in a charge accumulation stage, loading an ineffective level signal to the reset line and to the scan line, such that charge accumulation is performed by the photoelectric detection device; in a read stage, loading an effective level signal to the scan line, such that the voltage of the first node is transmitted to a data read line; and in a redundancy stage, loading an ineffective level signal to the san line and to the reset line, such that the first node is disconnected from the data read line by the data read sub-circuit.

In a fourth aspect, a manufacturing method for a display apparatus is provided. The manufacturing method includes: forming a plurality of photoelectric detection circuits on a first base to form a photoelectric detection substrate, wherein each of the plurality of photoelectric detection circuits is the photoelectric detection circuit in the above embodiments; forming a plurality of pixel structures on a second base to form a display substrate, wherein the display substrate includes a display side and a non-display side opposite to each other, and each of the plurality of pixel structures includes a light emitting device; and fixing the display substrate and the photoelectric detection substrate together, wherein the photoelectric detection substrate is located on the non-display side of the display substrate, an orthographic projection of each of photosensitive devices on the second base is within an orthographic projection of y number of pixel structures on the second base to receive light emitted by the y number of light emitting devices, $1 \leq y \leq 100$, and y is an integer.

In some embodiments, the light emitting device includes: a first electrode, a second electrode and a light emitting layer between the first electrode and the second electrode, the light emitting layer is located on a side of the first electrode of the light emitting device away from the second base; and each of the plurality of pixel structures further includes a light passing portion between the light emitting layer and the second base, and the light passing portion is used for passing light, such that a part of light emitted by the light emitting layer is emitted to the second base.

In some embodiments, the light passing portion includes a first light passing hole penetrating through a pixel driving circuit; or the light passing portion includes a light passing slit in the pixel driving circuit.

In some embodiments, the first electrode of the light emitting device is a reflective electrode, and the light passing portion further includes a second light passing hole penetrating through the first electrode of the light emitting device.

In some embodiments, the manufacturing method further includes: forming a lens layer including a plurality of lenses for converging light; and fixing the display substrate and the photoelectric detection substrate together including: fixing the lens layer on the non-display side of the display substrate, and fixing the photoelectric detection substrate on a side of the lens layer away from the display substrate.

BRIEF DESCRIPTION OF DRAWINGS

The drawings are intended to provide a further understanding of the present disclosure, and constitute a part of the specification to explain the present disclosure together with the following specific implementations, but not intended to limit the present disclosure. In the drawings:

FIG. 7b is a schematic diagram illustrating detection of light in a photoelectric detection circuit in FIG. 7a.

FIG. 8b is a schematic diagram illustrating detection of light in a photoelectric detection circuit in FIG. 8a.

FIG. 13b is a cross-sectional view taken along a line D-D' of FIG. 13a.

DETAIL DESCRIPTION OF EMBODIMENTS

The embodiments of the present disclosure will be described in detail below in combination with the drawings. It should be understood that the specific embodiments described herein are only used to illustrate and explain the present disclosure, but not to limit the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are only some of, not all of, embodiments of the present disclosure. All other embodiments, which can be derived by a person skilled in the art from the described embodiments of the present disclosure without the inventive step, are within the scope of the protection of the present disclosure.

Unless defined otherwise, technical terms or scientific terms used herein shall have the ordinary meaning as understood by one of ordinary skill in the art to which the present disclosure belongs. The use of "first", "second", and similar terms in the present disclosure is not intended to indicate any order, quantity, or importance, but rather is used to distinguish one element from another. Similarly, the word "comprise" or "include", and the like, mean that the element or item preceding the word comprises the element or item listed after the word and its equivalent, but does not exclude other elements or items. The word "connected" or "coupled" and the like is not restricted to physical or mechanical connection, but may include electrical connection, whether direct or indirect.

The transistors employed in all the embodiments of the present disclosure may be thin film transistors or field effect transistors or other devices of the same characteristics. Since a source electrode and a drain electrode of a transistor are symmetrical, there is no difference between the source electrode and the drain electrode. To distinguish the source electrode of the transistor and the drain electrode of the transistor, one of the source electrode and the drain electrode of the transistor is called a first electrode and the other of the source electrode and the drain electrode of the transistor is called a second electrode.

In addition, the transistors may be divided into N-type transistors and P-type transistors, and each of the transistors in the present disclosure may be independently selected from an N-type transistor or a P-type transistor. In the following embodiments, transistors in a display driving circuit each are N-type transistors, as an example, and the transistors in the display driving circuit may be simultaneously manufactured by the same manufacturing process. Accordingly, an effective level signal is a high level signal and an ineffective level signal is a low level signal.

Figure 1:
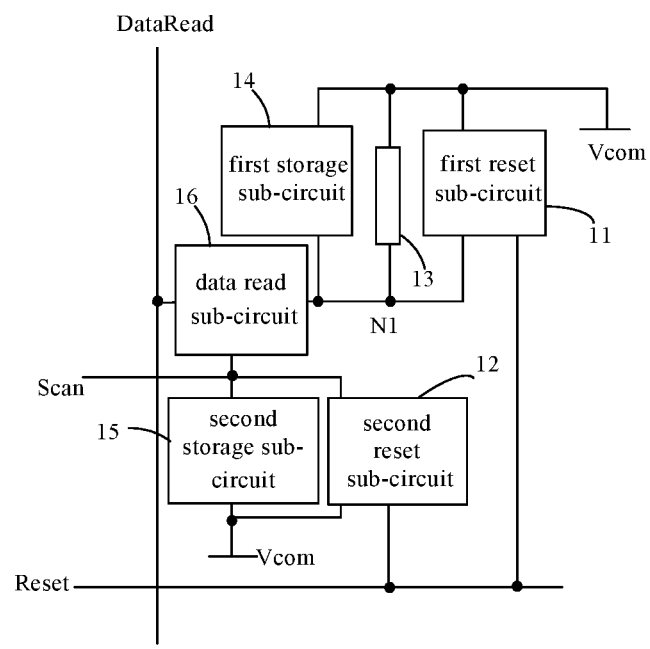
FIG. 1 is a schematic diagram of a photoelectric detection circuit in some embodiments of the present disclosure.

FIG. 1 is a schematic diagram of a photoelectric detection circuit in some embodiments of the present disclosure. As shown in FIG. 1, the photoelectric detection circuit includes: a first reset sub-circuit 11, a second reset sub-circuit 12, a first storage sub-circuit 14, a data read sub-circuit 16 and a photosensitive device 13. A first terminal of the data read sub-circuit 16, a first terminal of the first storage sub-circuit 14, a first electrode of the photosensitive device 13, and a first terminal of the first reset sub-circuit 11 are connected to a first node N1. A second electrode of the photosensitive device 13 is connected to a common voltage line.

Figure 2:
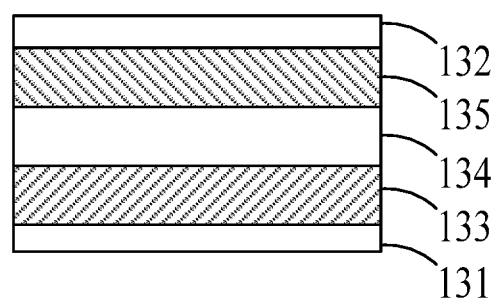
FIG. 2 is a schematic diagram of a structure of a photosensitive device in some embodiments of the present disclosure.

The photosensitive device 13 is configured to generate an inductive electrical signal based on a sensed light signal. FIG. 2 is a schematic diagram of a structure of a photosensitive device in some embodiments of the present disclosure. As shown in FIG. 2, the photosensitive device 13 may be a PIN photodiode, which specifically includes: a first electrode 131, a P-type semiconductor layer 133, an intrinsic layer 134, an N-type semiconductor layer 135, and a second electrode 132, which are stacked together.

The data read sub-circuit 16 is further connected to a scan line Scan and a data read line DataRead, and is configured to transmit a voltage of the first node N1 to the data read line DataRead in response to control of a signal of the scan line Scan.

The first reset sub-circuit 11 is further connected to a reset line Reset and the common voltage line Vcom, and the first reset sub-circuit 11 is configured to transmit a reference signal of the common voltage line Vcom to the first node N1 in response to control of a signal of the reset line Reset, thereby resetting the voltage of the first node N1.

The first storage sub-circuit 14 is connected between the first node N1 and the common voltage line Vcom, and the first storage sub-circuit 14 is configured to store a voltage between the first node N1 and the common voltage line Vcom.

The second reset sub-circuit 12 is connected to the reset line Reset, the scan line Scan, and the common voltage line Vcom, and the second reset sub-circuit 12 is configured to transmit a reference signal of the common voltage line Vcom to the scan line Scan in response to control of the signal of the reset line Reset, thereby resetting a voltage of the scan line Scan.

The operation stage of the photoelectric detection circuit of the embodiments of the present disclosure may include: a reset stage, a charge accumulation stage and a data read stage. In the reset stage, the reset line Reset is loaded with an effective level signal, so that the voltage of the first node N1 is reset by the first reset sub-circuit 11, and the voltage of the scan line Scan is reset by the second reset sub-circuit 12 at the same time. In the charge accumulation stage, charge accumulation is performed by the photosensitive device 13 based on the received light signal. In the data read stage, the voltage of the first node N1 is transmitted to the data read line DataRead by the data read sub-circuit by loading an effective level signal to the scan line Scan, such that the intensity of the light received by the photosensitive device 13 may be determined by an external processing circuit based on a voltage read by the data read line DataRead.

The photoelectric detection circuit in the embodiments of the present disclosure may be applied to an OLED display apparatus. In this case, the photosensitive device 13 may be used to receive at least a part of light emitted by a light emitting device in the OLED display apparatus, such that a compensation parameter of the light emitting device may be determined by an external compensation circuit based on a difference between an actual voltage read by the data read line DataRead and a theoretical voltage; and then a driving signal for the light emitting device may be determined by a driving circuit based on the compensation parameter of the light emitting device and a target light emitting brightness of the light emitting device, and the driving signal may be output to a pixel structure, such that the light emitting device may achieve the target light emitting brightness, and the light emitting brightness of different light emitting devices is consistent.

In some embodiments, as shown in FIG. 1, the photoelectric detection circuit further includes: a second storage sub-circuit 15 connected between the scan line Scan and the common voltage line Vcom, and the second storage sub-circuit 15 is configured to store a voltage between the scan line Scan and the common voltage line Vcom. During the operation of the photoelectric detection circuit, after the voltage of the scan line Scan is reset, the second storage sub-circuit 15 may be used to maintain the stability of the voltage of the scan line Scan, to prevent the voltage of the scan line Scan from affecting a state of the data read sub-circuit 16 in the charge accumulation stage, thereby ensuring the stability of the output voltage.

Figure 3:
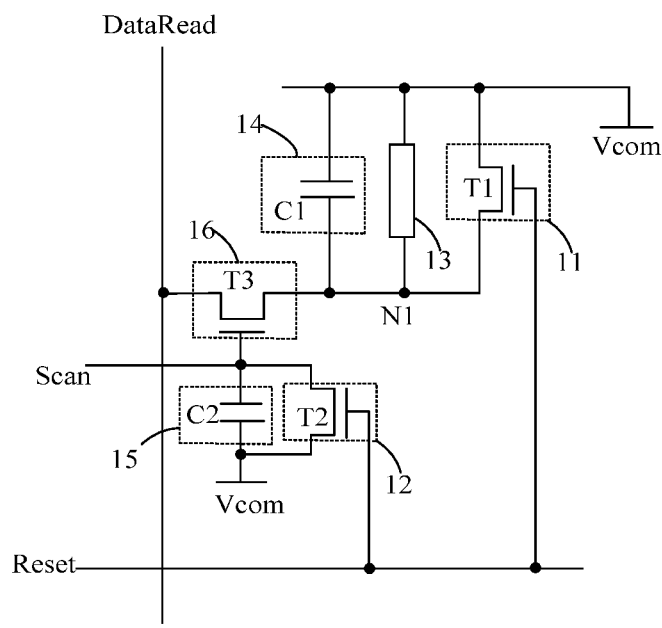
FIG. 3 is a schematic diagram of another photoelectric detection circuit in some embodiments of the present disclosure.

FIG. 3 is a schematic diagram of another photoelectric detection circuit in some embodiments of the present disclosure. As shown in FIG. 3, the photoelectric detection circuit is a specific embodiment of the photoelectric detection circuit shown in FIG. 1.

As shown in FIG. 3, in some embodiments, the first reset sub-circuit 11 includes: a first reset transistor T1 having a gate electrode connected to the reset line Reset, a first electrode connected to the common voltage line Vcom, and a second electrode forming the first terminal of the first reset sub-circuit 11, that is, the second electrode of the first reset transistor T1 is connected to the first node N1.

The data read sub-circuit 16 includes: a data read transistor T3 having a gate connected to the scan line Scan, a first electrode connected to the data read line DataRead, and a second electrode forming the first terminal of the data read sub-circuit 16, that is, the second electrode of the data read transistor T3 is connected to the first node N1.

In some embodiments, the second reset sub-circuit 12 includes: a second reset transistor T2 having a gate electrode connected to the reset line Reset, a first electrode connected to the common voltage line Vcom, and a second electrode connected to the scan line Scan.

In some embodiments, the first storage sub-circuit 14 includes: a first capacitor C1 connected to the common voltage line Vcom and the first node N1. The second storage sub-circuit 15 includes: a second capacitor C2 connected between the scan line Scan and the common voltage line Vcom.

Figure 4:
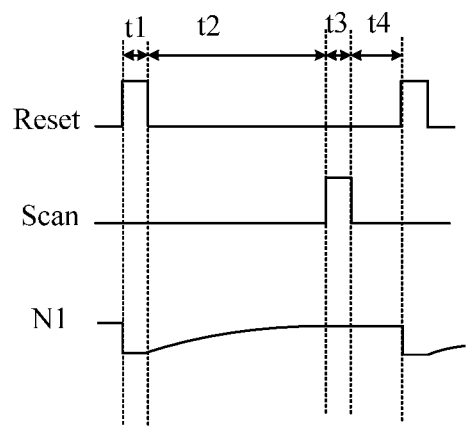
FIG. 4 is a timing diagram illustrating an operation of a photoelectric detection circuit shown in FIG. 3.

FIG. 4 is a timing diagram illustrating an operation of the photoelectric detection circuit shown in FIG. 3, and the operation of the photoelectric detection circuit shown in FIG. 3 will be described with reference to the drawings. As shown in FIG. 4, the operation of the photoelectric detection circuit includes a reset stage t1, a charge accumulation stage t2, a read stage t3, and a redundancy stage t4. The voltage of the common voltage line Vcom is a low level voltage.

In the reset stage t1, the reset line Reset is loaded with an effective level signal, and the scan line Scan is loaded with an ineffective level signal. In this case, both the first reset transistor T1 and the second reset transistor T2 are turned on, and the data read transistor is turned off. The first node N1 receives a voltage of the common voltage line Vcom, and the scan line Scan is electrically connected to the common voltage line Vcom and thus, is maintained at a low level voltage.

In the charge accumulation stage T2, the reset line Reset and the scan line Scan are loaded with an ineffective level signal. In this case, the first reset transistor T1, the second reset transistor T2 and the data read transistor T3 each are turned off. Under the voltage stabilization of the second capacitor C2, the voltage of the scan line Scan remains the same as that in the reset stage, thereby ensuring that the data read transistor T3 is turned off. The voltage of the first node N1 gradually rises with the photoelectric conversion of the photosensitive device 13.

In the read stage T3, the reset line Reset is loaded with an ineffective level signal, and the scan line Scan is loaded with an effective level signal. In this case, both the first reset transistor T1 and the second reset transistor T2 are maintained in a turned-off state, and the data read transistor T3 is turned on, so as to transmit the voltage of the first node N1 to the data read line DataRead, such that the voltage of the first node N1 may be read by an external processing circuit, and further, the intensity of the light received by the photosensitive device 13 is determined by the external processing circuit based on the voltage of the first node N1.

In the redundancy stage T4, the scan line Scan and the reset line Reset are loaded with an ineffective level signal, such that the first reset transistor T1, the second reset transistor T2, and the data read transistor T3 each are maintained in a turned-off state, and the first node N1 is disconnected from the data read line DataRead.

In a case of the same charge accumulation duration, since the intensity of the electrical signal generated by the photosensitive device 13 is positively correlated with the intensity of the received light, the duration of the charge accumulation stage may be set based on actual needs, to avoid a too low intensity of a detected signal when the brightness of the light emitted by the light emitting device is low, or to avoid saturation of the detected signal when the brightness of the light emitted by the light emitting device is high. Since the duration is constant in which a display substrate displays each frame of image, a duration of a duty cycle of the photosensitive device 13 (i.e., the total duration of the reset stage t1, the charge accumulation stage t2, the scan stage t3 and the redundancy stage t4) is constant. Then, when the duration of the charge accumulation stage t2 needs to be increased, the duration of the redundancy stage t4 may be decreased; and when the duration of the charge accumulation stage t2 needs to be decreased, the duration of the redundancy stage t4 may be increased, such that the duration of the duty cycle of the photosensitive device 13 remains unchanged.

In the embodiments of the present disclosure, the data read line DataRead, the scan line Scan, the common voltage line Vcom, transistors, capacitors, and the photosensitive device 13 in the photoelectric detection circuit each are provided on a first base. Optionally, the data read line DataRead and the scan line Scan are located in different layers insulated and spaced apart from each other. The scan line Scan extends in a first direction, the data read line DataRead extends in a second direction, and the first direction intersects with the second direction.

In some embodiments, active layers of respective transistors in the photoelectric detection circuit are provided in the same layer; the reset line Reset, the scan line Scan, and the common voltage line Vcom are provided in the same layer; and the reset line Reset and first and second electrodes of the respective transistors are provided in the same layer. It should be noted that "provided in the same layer" means that two structures are formed by performing a pattern process on the same material layer, and the two structures are in the same layer in the stacking relationship. However, it does not mean that a distance between one of the two structures and the first base is necessarily the same as that between the other of the two structures and the first substrate. For example, the active layers of the respective transistors are located in a semiconductor layer; the reset line Reset, the scan line Scan, and the common voltage line Vcom are located in a first metal layer; and the data read line DataRead and the first and second electrodes of the respective transistors are located in a second metal layer. The structure of layers and the connection between the layers of the photoelectric detection circuit in the embodiments of the present disclosure will be described below with reference to the drawings.

Figure 5A:
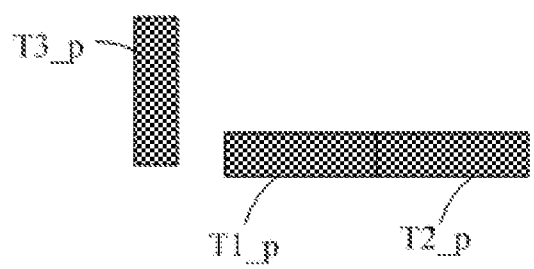
FIG. 5a is a plan view illustrating a semiconductor layer of a photoelectric detection circuit in some embodiments of the present disclosure.

FIG. 5a is a plan view illustrating a semiconductor layer of a photoelectric detection circuit in some embodiments of the present disclosure. Optionally, a material of a semiconductor layer poly1 may be polysilicon or metal oxide, which is not particularly limited in the embodiments of the present disclosure. As shown in FIG. 5a, the semiconductor layer poly1 includes: an active layer T1_p of the first reset transistor T1, an active layer T2_p of the second reset transistor T2, and an active layer T3_p of the data read transistor T3. The active layer T1_p of the first reset transistor T1 and the active layer T2_p of the second reset transistor T2 may be connected to each other and have a one-piece structure.

Figure 5B:
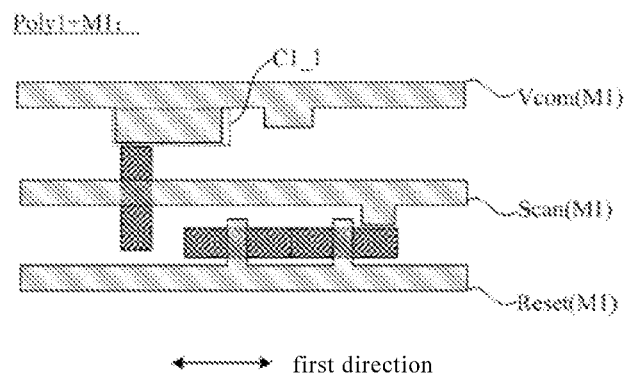
FIG. 5b is a plan view illustrating a semiconductor layer and a first metal layer of a photoelectric detection circuit in some embodiments of the present disclosure.

FIG. 5b is a plan view illustrating a semiconductor layer and a first metal layer of the photoelectric detection circuit in some embodiments of the present disclosure. Optionally, a material of the first metal layer M1 may be a metal material such as silver, aluminum, molybdenum, or copper, which is not specifically limited in the embodiments of the present disclosure. As shown in FIG. 5b, the first metal layer M1 is located on a side of the semiconductor layer poly1 away from the first base, and the first metal layer M1 is spaced apart from the semiconductor layer poly1 by an insulating layer. The first metal layer M1 includes: the common voltage line Vcom, the scan line Scan, the reset line Reset, the gate electrodes of the respective transistors, and a first plate C1_1 of the first capacitor C1.

For example, the common voltage line Vcom, the scan line Scan and the reset line Reset each extend in the first direction, and the scan line Scan is located between the common voltage line Vcom and the reset line Reset. The gate electrode of the data read transistor T3 is a part of the scan line Scan; and the gate electrode of the first reset transistor T1, the gate electrode of the second reset transistor T2 and the reset line Reset are formed as an unitary structure, that is, the gate electrode of the first reset transistor T1, the gate electrode of the second reset transistor T2 and the reset line Reset are formed as a single piece; or the gate electrode of the first reset transistor T1, the gate electrode of the second reset transistor T2 and the reset line Reset are respectively three conductive structures electrically connected to each other. The first plate of the first capacitor C1 and the common voltage line Vcom are formed as a one-piece structure, that is, the first plate of the first capacitor C1 and the common voltage line Vcom are formed as a single piece; or the first plate of the first capacitor C1 and the common voltage line Vcom are respectively two conductive structures electrically connected to each other.

Figure 5C:
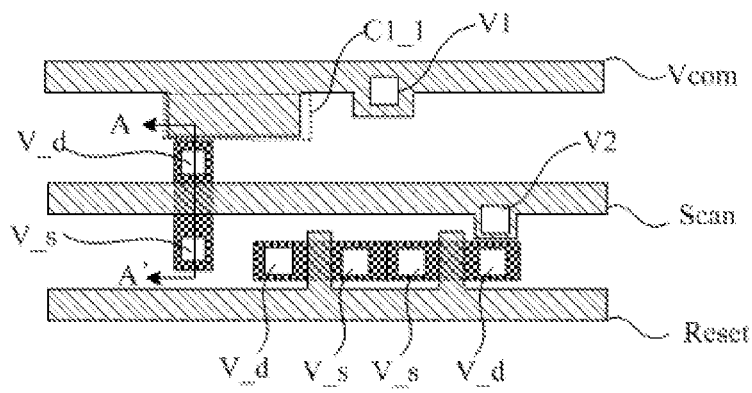
FIG. 5c is a schematic diagram illustrating via holes in a first insulating layer in some embodiments of the present disclosure.
Figure 5D:
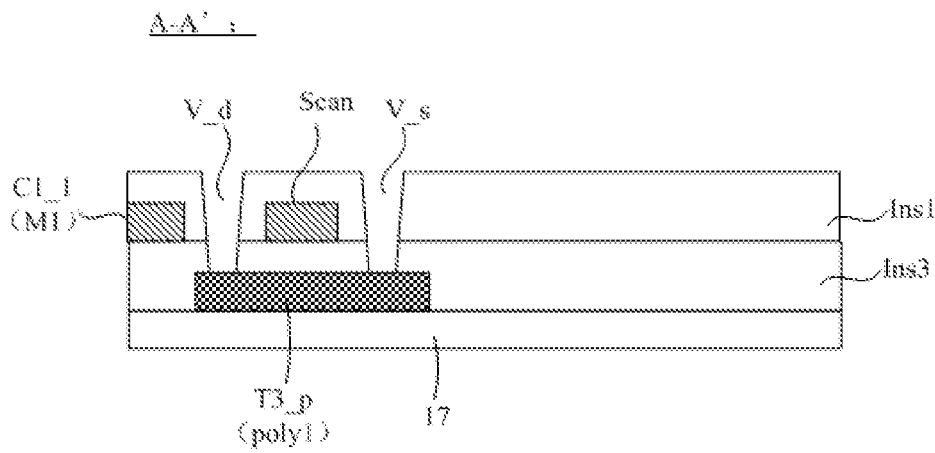
FIG. 5d is a cross-sectional view taken along a line A-A' in FIG. 5c.

FIG. 5c is a schematic diagram illustrating via holes in a first insulating layer in some embodiments of the present disclosure, and FIG. 5d is a cross-sectional view taken along a line A-A' in FIG. 5c. As shown in FIG. 5c and FIG. 5d, a third insulating layer Ins3 is provided between the first metal layer M1 and the semiconductor layer poly1, and a first insulating layer Ins1 is provided on a side of the first metal layer M1 away from the first base 17. Optionally, each of the first insulating layer Ins1 and the third insulating layer Ins3 may be a single layer or a plurality of layers selected from a silicon nitride layer, a silicon oxide layer, and a silicon oxynitride layer. The first insulating layer Ins1 is provided with a plurality of via holes therein. The via holes in the first insulating layer Ins1 include a first via hole V1, a second via hole V2, source via holes V_s, and drain via holes V_d. The first via hole V1 exposes a part of the common voltage line Vcom; and the second via hole V2 exposes a part of the scan line Scan. A active layer of each transistor corresponds to one source via hole V_s and one drain via hole V_d.

Figure 5E:
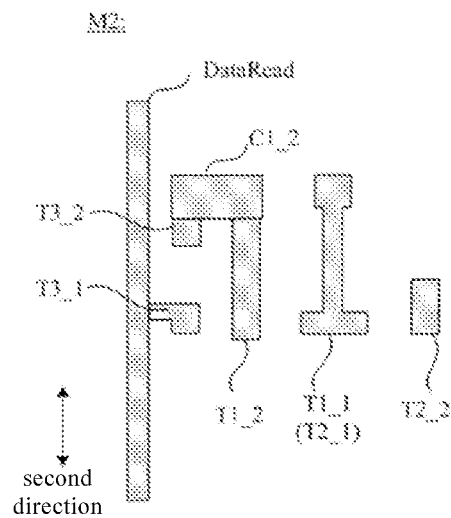
FIG. 5e is a plan view illustrating a second metal layer of a photoelectric detection circuit in some embodiments of the present disclosure.
Figure 5F:
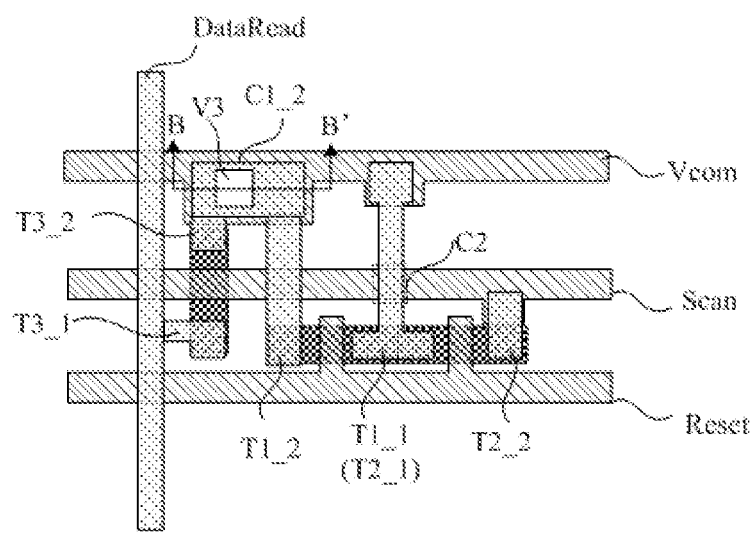
FIG. 5f is a plan view illustrating a semiconductor layer of a photoelectric detection circuit in some embodiments of the present disclosure.

FIG. 5e is a plan view illustrating a second metal layer of a photoelectric detection circuit in some embodiments of the present disclosure, and FIG. 5f is a plan view illustrating a semiconductor layer, a first metal layer, a second metal layer of a photoelectric detection circuit in some embodiments of the present disclosure. Optionally, a material of the second metal layer M2 may be a metal material such as silver, aluminum, molybdenum, or copper, which is not specifically limited in present disclosure. As shown in FIG. 5c to FIG. 5f, the second metal layer M2 is located on a side of the first insulating layer Ins1 away from the semiconductor layer poly1, and the second metal layer M2 includes: the data read line DataRead, a second plate C1_2 of the first capacitor C1, and the first and second electrodes of the respective transistors. The first electrodes of the respective transistors are connected to respective active layers through corresponding source via holes V_s, and the second electrodes of the respective transistors are connected to respective active layers through corresponding drain via holes V_d. Orthographic projections of the first electrode T3_1 and the second electrode T3_2 of the data read transistor T3 on the first base are respectively located at two sides of an orthographic projection of the scan line Scan on the first base in the second direction. The first electrode T1_1 of the first reset transistor T1 is connected to the common voltage line Vcom through the first via hole V1. The second electrode T2_2 of the second reset transistor T2 is connected to the scan line Scan through the second via hole V2. Optionally, the first electrode T3_1 of the data read transistor T3 and the data read line DataRead are formed as a unitary structure; and the second plate C1_2 of the first capacitor C1, the second electrode T1_2 of the first reset transistor T1 and the second electrode T3_2 of the data read transistor T3 are formed as a unitary structure. That is, the first electrode T3_1 of the data read transistor T3 and the data read line DataRead are formed as a single piece, or the first electrode T3_1 of the data read transistor T3 and the data read line DataRead are respectively two conductive structures electrically connected to each other. The second plate C1_2 of the first capacitor C1, the second electrode T1_2 of the first reset transistor T1 and the second electrode T3_2 of the data read transistor T3 are formed as a single piece; or the second plate C1_2 of the first capacitor C1, the second electrode T1_2 of the first reset transistor T1 and the second electrode T3_2 of the data read transistor T3 are respectively three conductive structures electrically connected to each other. The first electrode T1_1 of the first reset transistor T1 and the first electrode T2_1 of the second reset transistor T2 are formed as an unitary structure, and herein, the first electrode T1_1 of the first reset transistor T1 and the first electrode T2_1 of the second reset transistor T2 are formed as an single electrode block, which may serve as the first electrode T1_1 of the first reset transistor T1 and may also serve as the first electrode T2_1 of the second reset transistor T2. Alternatively, the first electrode T1_1 of the first reset transistor T1 and the first electrode T2_1 of the second reset transistor T2 are respectively two electrode blocks electrically connected to each other.

In addition, as shown in FIG. 5f, the first electrode T1_1 of the first reset transistor T1 (i.e., the first electrode T2_1 of the second reset transistor T2) crosses over and is insulated from the scan line Scan, and the cross portions form the second capacitor C2. That is, the first plate of the second capacitor C2 is a part of the scan line Scan, and the second plate of the second capacitor C2 is a part of the first electrode T1_1 of the first reset transistor T1.

Figure 5G:
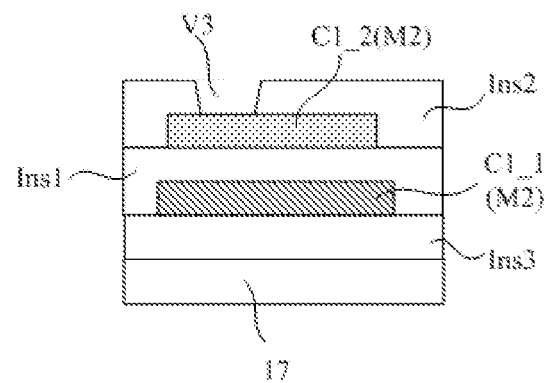
FIG. 5g is a cross-sectional view taken along a line B-B' of FIG. 5f.

FIG. 5g is a cross-sectional view taken along a line B-B' of FIG. 5f. As shown in FIG. 5g, a second insulating layer Ins2 is provided on a side of a layer, in which the second plate C1_2 of the first capacitor C1 is located, away from the first base 17. Optionally, the second insulating layer Ins2 may be a single layer or a plurality of layers selected from a silicon nitride layer, a silicon oxide layer and a silicon oxynitride layer. The second insulating layer Ins2 is provided with a third via hole V3 therein. As shown in FIG. 5f and FIG. 5g, the third via hole V3 exposes a part of the second plate C1_2 of the first capacitor C1.

Figure 5H:
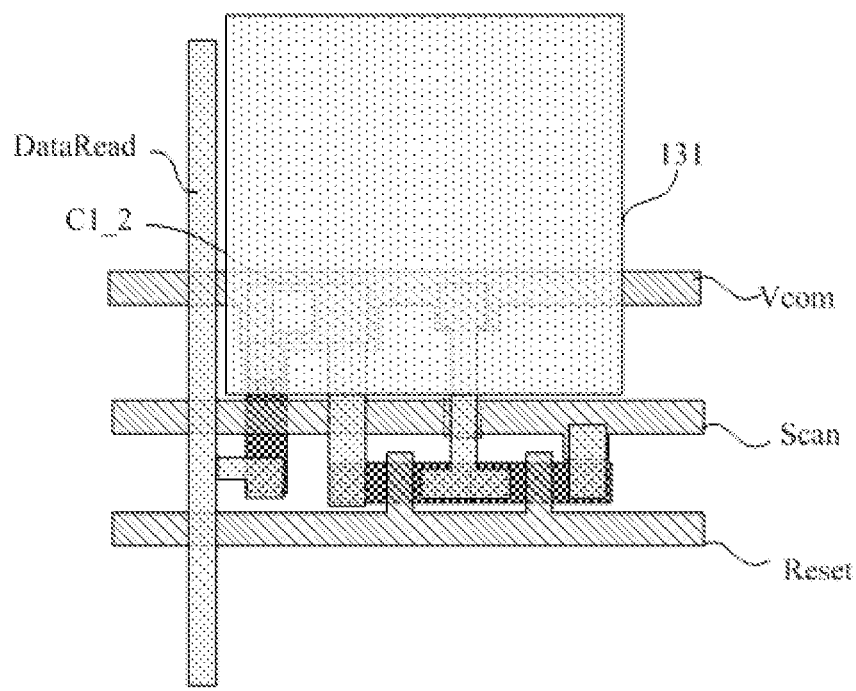
FIG. 5h is a schematic diagram illustrating a semiconductor layer, a first metal layer, a second metal layer, and a first electrode of a photosensitive device in a photoelectric detection circuit in some embodiments of the present disclosure.

In some embodiments, the photosensitive device 13 is provided on a side of the second insulating layer Ins2 away from the first base 17. FIG. 5h is a schematic diagram illustrating a semiconductor layer, a first metal layer, a second metal layer, and a first electrode of a photosensitive device in a photoelectric detection circuit in some embodiments of the present disclosure. As shown in FIG. 5f to FIG. 5h, the first electrode of the photosensitive device 13 is connected to the second plate C1_2 of the first capacitor C1 through the third via hole V3 to form the first node N1 in FIG. 3.

An orthographic projection of the first electrode 131 of the photosensitive device 13 on the first base does not overlap with an orthographic projection of the data read line DataRead on the first base. An orthographic projection of the second electrode 132 of the photosensitive device 13 on the first base exceeds the orthographic projection of the first electrode 131 of the photosensitive device 13 on the first base to prevent the second electrode 132 from being short-circuited with the first electrode 131 when the second electrode 132 is connected to the common voltage line Vcom. The second electrode 132 of the photosensitive device 13 is a transparent electrode made of a transparent conductive material (e.g., indium tin oxide, etc.), so as to facilitate the photosensitive device 13 to receive the light emitted by the light emitting device. The term "transparent" in the embodiments of the present disclosure may mean that a light transmittance is of 80% or more.

Figure 5I:
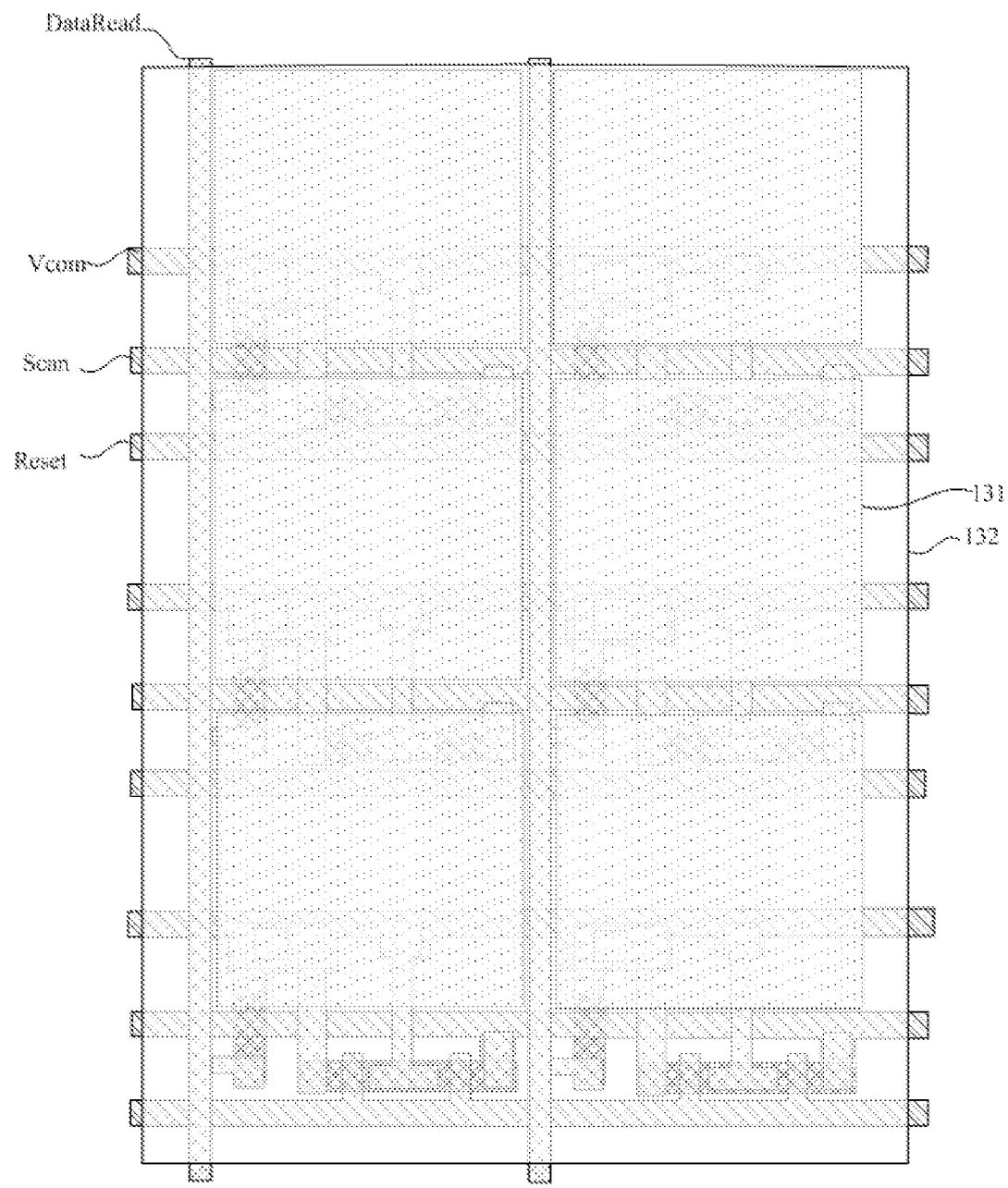
FIG. 5i is a plan view illustrating a plurality of photoelectric detection circuits in some embodiments of the present disclosure.

FIG. 5i is a plan view illustrating a plurality of photoelectric detection circuits in some embodiments of the present disclosure, and for clarity of illustration, the P-type semiconductor layer 133, the intrinsic layer 134, and the N-type semiconductor layer 135 of the photosensitive device 13 are omitted in FIG. 5i. It should be noted that, the P-type semiconductor layer 133, the intrinsic layer 134, and the N-type semiconductor layer 135 of the photosensitive device 13 and the first electrode 131 of the photosensitive device 13 may be formed by a photolithographic patterning process in a single step, and therefore, each of orthographic projections of the P-type semiconductor layer 133, of the intrinsic layer 134, and of the N-type semiconductor layer 135 of the photosensitive device 13 on the first base may be the same as the orthographic projection of the first electrode 131 of the photosensitive device 13 on the first base. As shown in FIG. 5i, a plurality of photoelectric detection circuits arranged in an array may be provided on the first base. Photoelectric detection circuits in the same column may be connected to the same data read line DataRead, photoelectric detection circuits in the same row may be connected to the same scan line Scan, the photoelectric detection circuits in the same row may be connected to the same common voltage line Vcom, and the photoelectric detection circuits in the same row may be connected to the same reset line Reset. Second electrodes 132 of photosensitive devices 13 in the plurality of photoelectric detection circuits may be connected to each other to form a unitary layer structure. Therefore, for one of the photosensitive devices 13, the orthographic projection of the second electrode 132 of the photosensitive device 13 on the first base exceeds the orthographic projection of the first electrode 131 on the first base. The part of the second electrode 132 exceeding the first electrode 131 is connected to the common voltage line Vcom through a via hole penetrating through the first insulating layer and the second insulating layer. For example, a common voltage bus may be provided in an edge region of the first base. The common voltage bus is connected to each of common voltage lines Vcom, and the second electrode 132 is connected to the common voltage bus through the via hole penetrating through the first and second insulating layers.

The orthographic projection of the first electrode 131 of the photosensitive device 13 on the first base at least covers an orthographic projection of the first capacitor C1 on the first base. In some examples, as shown in FIG. 5h and FIG. 5i, the orthographic projection of the first electrode 131 of the photosensitive device 13 on the first base covers the orthographic projection of the first capacitor C1 in the photoelectric detection circuit including the photosensitive device 13 on the first base, overlaps with an orthographic projection of the data read transistor T3 in the photoelectric detection circuit including the photosensitive device 13 on the first base, and also overlaps with orthographic projections, on the first base, of the data read transistor T3, of the first reset transistor T1 and of the second reset transistor T2 in the photoelectric detection circuit in a previous row. Of course, in other embodiments, the orthographic projection of the first electrode 131 of the photosensitive device 13 on the first base may also cover the orthographic projections, on the first base, of the first capacitor C1, of the data read transistor T3, of the first reset transistor T1 and of the second reset transistor T2 in the photoelectric detection circuit including the photosensitive device 13.

Figure 6:
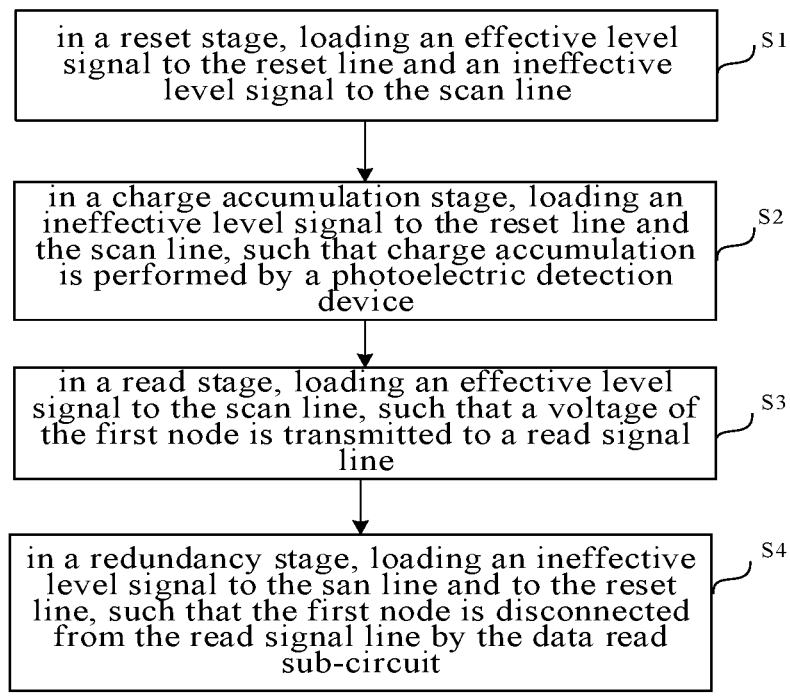
FIG. 6 is a flowchart illustrating a driving method for a photoelectric detection circuit in some embodiments of the present disclosure.

A driving method for the above photoelectric detection circuit is further provided in the embodiments of the present disclosure, and FIG. 6 is flowchart illustrating a driving method for a photoelectric detection circuit in some embodiments of the present disclosure. As shown in FIG. 6, the driving method includes:

In step S1, in the reset stage, the voltage of the first node is reset by the first reset sub-circuit, and the voltage of the scan line is reset by the second reset sub-circuit by loading an effective level signal to the reset line and an ineffective level signal to the scan line.

In step S2, in the charge accumulation stage, charge accumulation is performed by the photosensitive device by loading an ineffective level signal to the reset line and to the scan line.

In step S3, in the read stage, the voltage of the first node is transmitted to the data read line by loading an effective level signal to the scan line.

In step S4, in the redundancy stage, the first node is disconnected from the data read line by the data read sub-circuit by loading an ineffective level signal to the scan line and to the reset line.

The specific operation of the photoelectric detection circuit has been described above and will not be described herein.

Figure 7A:
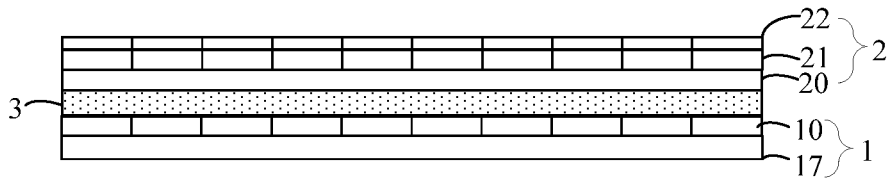
FIG. 7a is a schematic diagram of a structure of a display apparatus in some embodiments of the present disclosure.

A display apparatus is further provided in the embodiments of the present disclosure. FIG. 7a is a schematic diagram of a structure of a display apparatus in some embodiments of the present disclosure. As shown in FIG. 7a, the display apparatus includes a display substrate 2 and a photoelectric detection substrate 1. The display substrate 2 includes a display side and a non-display side opposite to each other. The photoelectric detection substrate 1 includes: a first base 17 and a plurality of photoelectric detection circuits 10 provided on the first base 17. Each of the plurality of photoelectric detection circuits 10 is the photoelectric detection circuit 10 in any of the above embodiments. The photoelectric detection substrate 1 is located on the non-display side of the display substrate 2. The photosensitive device of the photoelectric detection circuit 10 is directly opposite to at least one light emitting device 22 to receive the light emitted by the light emitting device 22.

The display substrate 2 includes: a second base 20 and a plurality of pixel structures on the second base 20. Each of the plurality of pixel structures includes a light emitting device 22 and a pixel driving circuit 21. The light emitting device 22 in the embodiments of the present disclosure may be a light emitting device 22 driven by a current (including an LED (Light Emitting Diode) or an OLED (Organic Light Emitting Diode)), and the embodiments of the present disclosure is described by taking the OLED as an example. It should be noted that, the display side of the display substrate 2 is a side where a viewer is located when the display substrate 2 performs display; and the non-display side of the display substrate 2 is a side opposite to the display side.

Figure 7B:
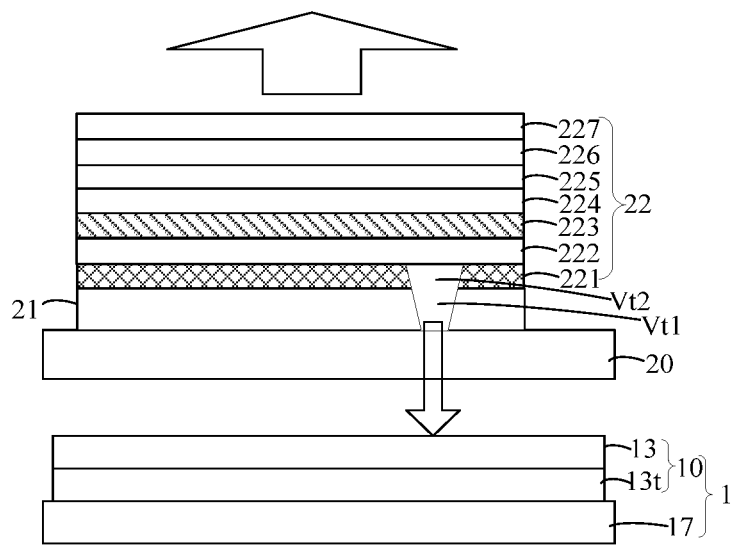

In some embodiments, a part of the light emitted by the light emitting device 22 exits towards the display side, and the other part of the light emitted by the light emitting device 22 is directed to the non-display side of the display substrate 2. FIG. 7b is a schematic diagram illustrating detection of light in a photoelectric detection circuit in FIG. 7a, and an arrow in FIG. 7b indicates light. As shown in FIG. 7b, the light emitting device 22 is provided on a side of the pixel driving circuit 21 away from the second base 20. The light emitting device 22 includes, provided sequentially in a direction away from the second base 20: a first electrode 221, a hole injection layer 222, a hole transport layer 223, a light emitting layer 224, an electron transport layer 225, an electron injection layer 226, and a second electrode 227. Optionally, the first electrode 221 is an anode, and the second electrode 227 is a cathode.

In order to direct a part of the light emitted by the light emitting device 22 to a side of the second base 20 away from the light emitting device 22, in the embodiments of the present disclosure, the pixel structure further includes a light passing portion located between the light emitting layer 224 and the second base 20. The light passing portion is used for passing the light therethrough, such that a part of light emitted by the light emitting layer 224 is emitted to the second base 20 and further passes through the second base 20 to irradiate to the non-display side. The photoelectric detection circuit 10 includes a photosensitive device 13 and a photosensitive device driving structure 13t. The photosensitive device driving structure 13t includes the first reset transistor T1, the second reset transistor T2, the data read transistor T3, the first capacitor C1, and the second capacitor C2 in the above embodiments. The photosensitive device 13 is provided between the photosensitive device driving structure 13t and the second base 20 to receive a part of the light emitted by the light emitting device 22.

In the embodiments of the present disclosure, the pixel driving circuit 21 includes conductive film layers, such as a semiconductor layer, a first gate metal layer, a second gate metal layer, a first source-drain metal layer, a second source-drain metal layer, and the like, and the conductive film layers are spaced apart from each other by insulating layers (e.g., a first gate insulating layer, a second gate insulating layer, etc.). Each of the conductive film layers includes a plurality of opaque conductive patterns. For example, the first gate metal layer includes gate lines, gate electrodes of a plurality of transistors, and the like, and the semiconductor layer includes active layers of the plurality of transistors, which will be described later. In some examples, the light passing portion may include a first light passing hole Vt1 penetrating through the pixel driving circuit 21. For example, the first light passing hole Vt1 penetrates through the insulating layer, and an orthographic projection of the first light passing hole Vt1 on the second base 20 does not overlap with orthographic projections of the conductive patterns in the pixel driving circuit 21 on the second base 20.

In other examples, the light passing portion includes a light passing slit in the pixel driving circuit 21. For example, each of the insulating layers between the conductive film layers is made of a transparent material, and the light passing slit is a gap between the conductive patterns. In this case, the first light passing hole Vt1 may not be provided, and the light emitted by the light emitting device 22 may pass through the gap between the conductive patterns and is directly transmitted through the insulating layers to irradiate to the photosensitive device 13.

It should be noted that, the first electrode 221 of the light emitting device 22 in the embodiments of the present disclosure may be a reflective electrode. In this case, the light passing portion further includes a second light passing hole Vt2 penetrating through the first electrode 221. A orthographic projection of the second light passing hole Vt2 on the second base 20 overlaps with an orthographic projection of the first light passing hole Vt1 (or of the light passing slit) on the second base 20. Of course, the first electrode 221 may be a transparent electrode. In this case, the first electrode 221 may or may not be provided with a second light passing hole Vt2.

As shown in FIG. 3 and FIG. 7a, in some embodiments, one photosensitive device 13 may be opposite to one light emitting device 22, or may be opposite to multiple light emitting devices 22. When one photosensitive device 13 is opposite to one light emitting device 22, the one photosensitive device 13 receives the light emitted by the one light emitting device 22; and when the one photosensitive device is opposite to the multiple light emitting devices 22, the multiple light emitting devices 22 may be controlled to emit light in different light emitting stages, respectively, so as to ensure that the photosensitive device 13 receives the light emitted by different light emitting devices 22 in different light emitting stages. In some embodiments, an orthographic projection of each of the photosensitive devices 13 on the second base 20 is within an orthographic projection of y number of pixel structures on the second base 20, where $1 \leq y \leq 100$ and y is an integer, thereby ensuring the detection precision and preventing the manufacturing process from being too difficult. The case where the orthographic projection of each of the photosensitive devices 13 on the second base 20 is located within the orthographic projection of the y number of pixel structures on the second base 20, may mean that each of the photosensitive devices 13 is provided directly opposite to the y number of pixel structures to receive the light emitted by the y number of light emitting devices 22. The orthographic projection of each of the pixel structures on the second base 20 may have an area of 70 square microns. However, the display substrate 2 may also be suitable for a product with higher resolution. In this case, the orthographic projection of each of the pixel structures on the second base 20 may have an area less than 70 square microns. When the area of the orthographic projection of a single pixel structure on the second base 20 is changed, the area of the orthographic projection of each of the photosensitive devices 13 on the second base 20 is also changed correspondingly, but the proportion between the orthographic projection of each of the photosensitive devices 13 on the second base 20 and the orthographic projection of the pixel structures on the second base 20 is constant. For example, the orthographic projection of each of the photosensitive devices 13 on the second base 20 is within the orthographic projection of 4*4 (i.e., 16) pixel structures on the second base 20, and each of the photosensitive devices 13 is directly opposite to 4*4 pixel structures.

In some embodiments, an optical adhesive layer 3 is further provided between the display substrate 2 and the photoelectric detection substrate, so that the display substrate 2 is bonded with the photoelectric detection substrate 1 by the optical adhesive layer 3.

Figure 8A:
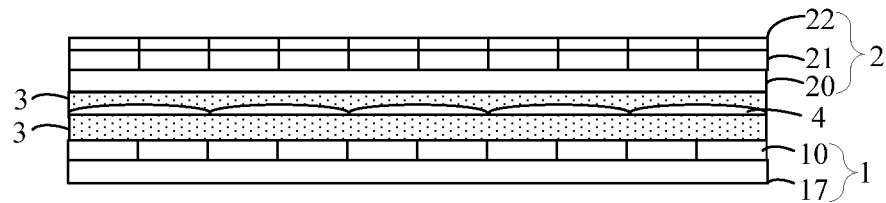
FIG. 8a is a schematic diagram of a structure of another display apparatus in some embodiments of the present disclosure.
Figure 8B:
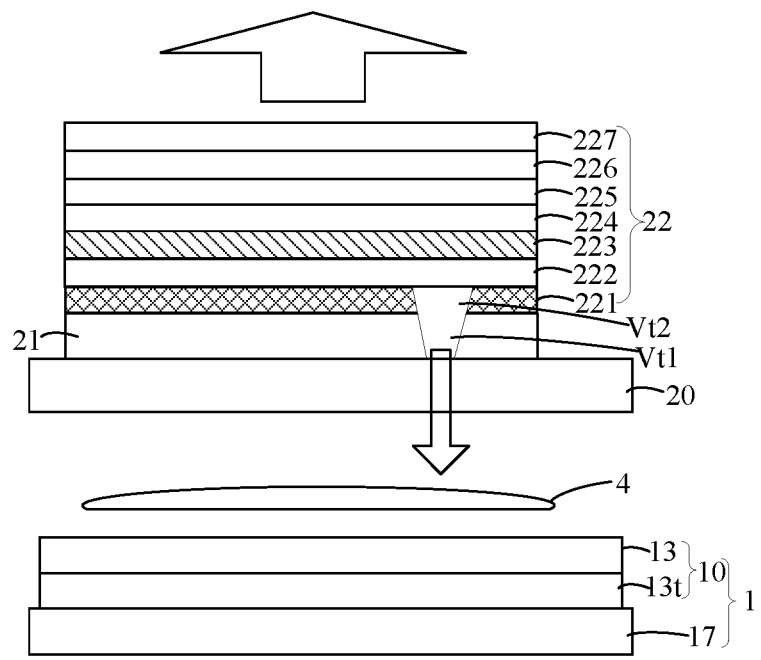

FIG. 8a is a schematic diagram of a structure of a display apparatus in some embodiments of the present disclosure, FIG. 8b is a schematic diagram illustrating detection of light in a photoelectric detection circuit in FIG. 8a, and an arrow in FIG. 8b indicates light. As shown in FIG. 8a, the display apparatus further includes: a lens layer between the display substrate 2 and the photoelectric detection substrate. The lens layer includes a plurality of lenses 4. An optical adhesive layers 3 are provided between the lens layer and the display substrate 2 and between the lens layer and the photoelectric detection substrate. The plurality of lenses 4 of the lens layer are arranged in multiple rows and multiple columns, and each of the plurality of lenses 4 may be directly opposite to one or more light emitting devices 22. A lens 4 may be a convex lens for converging light. Similarly to FIG. 7b, a part of the light emitted by the light emitting device 22 is irradiated to the photosensitive device 13 through the light passing portion in FIG. 8b; and unlike FIG. 7b, the light is further converged by the lens 4 before irradiating to the photosensitive device 13 in FIG. 8b.

In the embodiments of the present disclosure, the second base 20 may be a glass base, for example, having a thickness of 100 μm to 500 μm, or may be a thin flexible base, for example, made of Polyimide (PI) and having a thickness of 3 μm to 20 μm. When the second base 20 is a glass base with a large thickness, the light emitted from the light emitting device 22 to the non-display side may be greatly diverged, and the converging action of the lens 4 may reduce divergence angle of the light, so as to enhance the accuracy of the electrical signal generated by the photosensitive device 13. When the second base 20 is a flexible base having a small thickness, the light emitted from the light emitting device 22 to the non-display side is less diverged, and thus, a lens layer may or may not be provided.

Figure 9A:
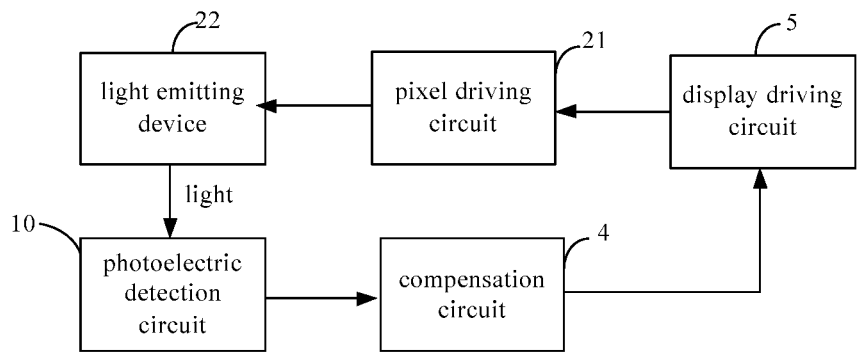
FIG. 9a is a schematic diagram illustrating an operating principle of a display apparatus in some embodiments of the present disclosure.

FIG. 9a is a schematic diagram illustrating an operating principle of a display apparatus in some embodiments of the present disclosure. As shown in FIG. 9a, the display apparatus further includes a compensation circuit 4 and a display driving circuit 5. The compensation circuit 4 is connected to the data read line DataRead, and is configured to determine a compensation parameter of the light emitting device 22 based on a difference between an actual voltage and a theoretical voltage of the data read line DataRead. The compensation circuit 4 may include a signal read sub-circuit and a signal processing sub-circuit. The signal read sub-circuit may be configured to read a voltage of the data read line DataRead, and the signal processing sub-circuit is configured to perform signal processing, such as analog-to-digital conversion, on a voltage signal output by the signal read sub-circuit. The display driving circuit 5 is connected to the compensation circuit 4 and to the pixel driving circuit 21 of the pixel structure, is configured to determine a driving signal for the light emitting device 22 based on the compensation parameter of the light emitting device 22 and a target brightness of the light emitting device 22, and outputs the driving signal to the pixel driving circuit 21 of the pixel structure, such that the light emitting device 22 may achieve the target brightness when the light emitting device 22 is driven by the pixel driving circuit 21.

An actual voltage may be a voltage signal actually read from the data read line DataRead when a test image is displayed on the display substrate; and a theoretical voltage is a voltage signal that should be theoretically read from the data read line DataRead when the test image is displayed on the display substrate and the light emitting device 22 achieves an ideal brightness. It is understood that, a difference between the actual voltage and the theoretical voltage of the data read line DataRead may occur due to the aging of the light emitting device 22 and the threshold shift of the transistors in the pixel driving circuit 21. When a target image is displayed subsequently on the display substrate, the display driving circuit 5 may determine the target brightness of the light emitting device 22 based on the target image to be displayed, determine an initial driving signal corresponding to the target brightness, adjust the initial driving signal based on the compensation parameter of the light emitting device 22, obtain a compensated driving signal, and then provide the compensated driving signal to the pixel driving circuit 21, so as to drive the light emitting device 22 to emit light.

Figure 9B:
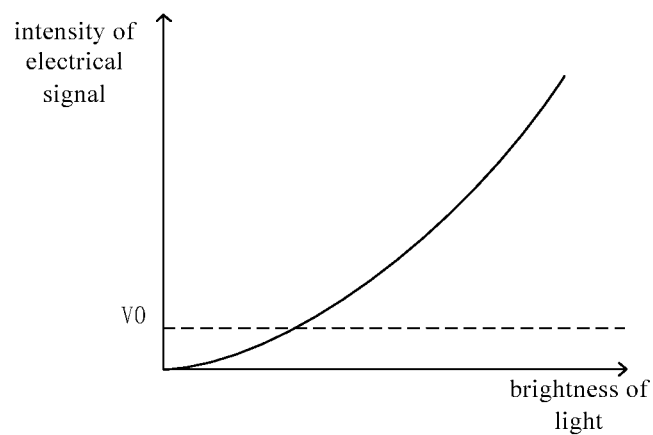
FIG. 9b is a graph illustrating a relationship between intensity of an electrical signal generated by a photosensitive device and brightness of light under a constant duration in a charge accumulation stage.
Figure 9C:
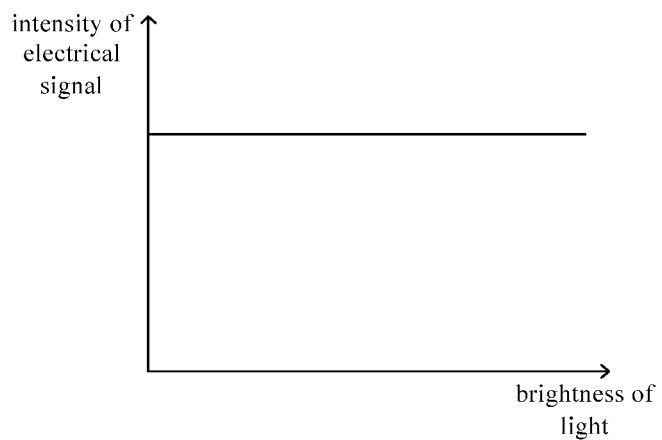
FIG. 9c is a graph illustrating a relationship between intensity of an electrical signal and brightness of light after duration adjustment.

FIG. 9b is a graph illustrating a relationship between intensity of an electrical signal generated by a photosensitive device and brightness of light under a constant duration in a charge accumulation stage, and FIG. 9c is a graph illustrating a relationship between intensity of an electrical signal and brightness of light after duration adjustment. As can be seen from FIG. 9b, when the duration of the charge accumulation stage of the photoelectric detection circuit 10 is a constant, the greater the intensity of light detected by the photosensitive device 13 is, and the greater the intensity of the generated electrical signal is. When the intensity of the electrical signal is lower than a threshold value V0, the electrical signal may not be recognized by the compensation circuit 4. When the brightness of light is constant, the intensity of the electrical signal generated by the photosensitive device may be changed by changing the duration of the charge accumulation stage. Therefore, in the embodiments of the present disclosure, the duration of the charge accumulation stage of each of the photoelectric detection circuits 10 may be adjusted, such that the duration of the charge accumulation stage of the photoelectric detection circuit 10 is reduced when the brightness of the light emitted by the light emitting device 22 is high; and the duration of the charge accumulation stage of the photoelectric detection circuit 10 is increased when the brightness of the light emitted by the light emitting device 22 is low. In this case, the intensity of the electric signals generated by the photosensitive devices 13 is consistent at different brightness of light, and the intensity of the electric signals is higher than V0, as shown in FIG. 9c.

For example, in a case where the light emitting device 22 emits light of an actual brightness of L1 and the duration of the charge accumulation stage of the photoelectric detection circuit 10 is time1, the voltage which should be read by the data read line DataRead should be Vd; and in a case where the light emitting device 22 emits light of an actual brightness of L2 and the duration of the charge accumulation stage of the photoelectric detection circuit 10 is time2, the voltage which is read by the data read line DataRead should be Vd. In this case, when a certain frame of test picture is displayed on the display substrate and the light emitting device 22 needs to achieve the brightness of L1 in the test picture, the duration of the charge accumulation stage of the photoelectric detection circuit 10 is controlled to be time1. In this case, if there is a difference between a voltage Vd' read by the data read line DataRead and Vd, it indicates that the light emitting device 22 does not achieve the ideal brightness L1. Therefore, the compensation value of the light emitting device 22 may be determined based on the difference between Vd' and Vd, and thus, the driving voltage for the light emitting device 22 is compensated based on the compensation value of the light emitting device 22 when the target image is subsequently displayed on the display substrate.

Figure 10:
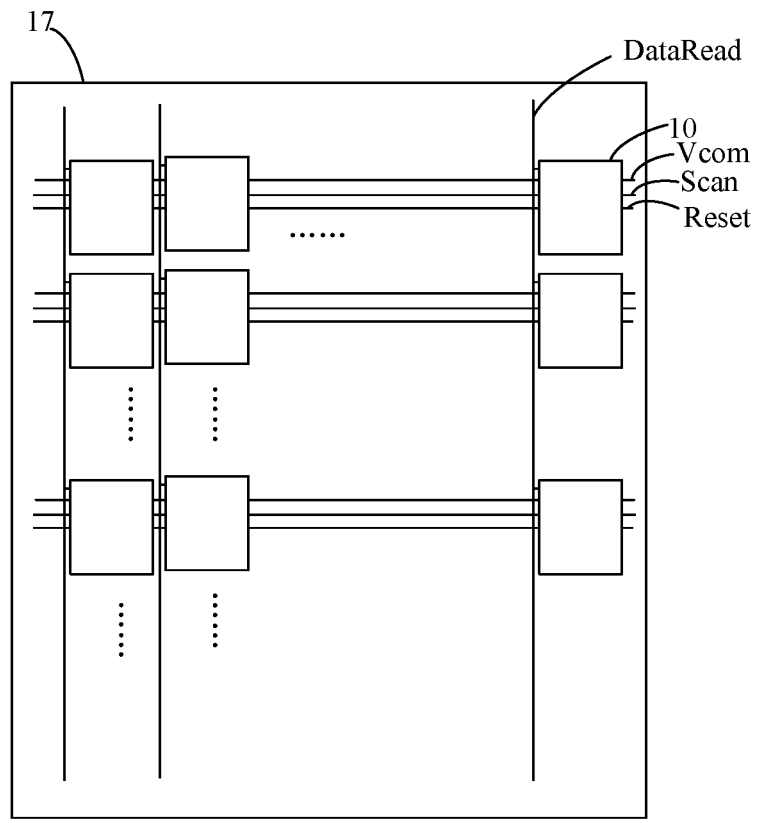
FIG. 10 is a schematic diagram illustrating an arrangement of photoelectric detection circuits in some embodiments of the present disclosure.

In the embodiments of the present disclosure, the light emitting devices 22 may be arranged in an array, and accordingly, the plurality of photoelectric detection circuits 10 of the photoelectric detection substrate 1 are also arranged in an array. FIG. 10 is a schematic diagram illustrating an arrangement of photoelectric detection circuits in some embodiments of the present disclosure. As shown in FIG. 10, the photoelectric detection circuits 10 in the same column may be connected to the same data read line DataRead, the photoelectric detection circuits 10 in the same row are connected to the same scan line Scan, the photoelectric detection circuits 10 in the same row are connected to the same common voltage line Vcom, and the photoelectric detection circuits 10 in the same row are connected to the same reset line Reset. The second electrodes of the plurality of photosensitive devices 13 may be connected to each other and formed as an unitary structure, that is, the second electrodes of the plurality of photosensitive devices 13 may be connected to each other and formed as a single piece, and may be connected to the common voltage line Vcom through a via hole at an edge region of the first base 17.

Figure 11:
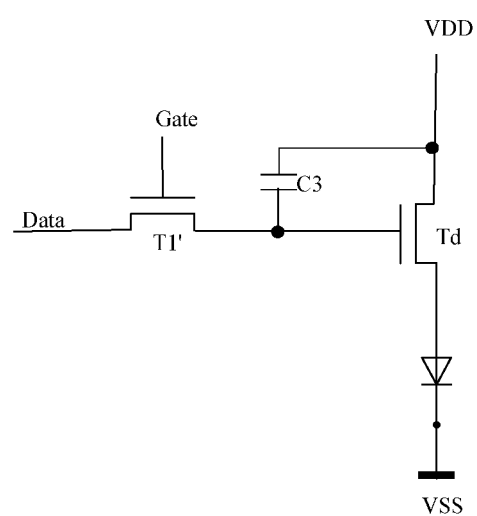
FIG. 11 is a schematic diagram illustrating a pixel driving circuit in some embodiments of the present disclosure.

FIG. 11 is a schematic diagram illustrating a pixel driving circuit in some embodiments of the present disclosure. As shown in FIG. 11, the pixel driving circuit 21 may be a simple structure of 2T1C (i.e., two transistors and one capacitor), so as to simplify the structure of the display substrate 2 and facilitate enhancement of the resolution of the display apparatus. Specifically, the pixel drive circuit 21 includes: a driving transistor Td, a data writing transistor T1' and a third capacitor C3. A gate electrode of the data writing transistor T1' is connected to a gate line Gate, a first electrode of the data writing transistor T1' is connected to a data line Data, and a second electrode of the data writing transistor T1' is connected to a gate electrode of the driving transistor Td. A first electrode of the driving transistor Td is connected to a first power line VDD, a second electrode of the driving transistor Td is connected to a first electrode of the light emitting device 22. A second electrode of the light emitting device 22 is connected to a second power line VSS. Two terminals of the third capacitor C3 are connected to the gate electrode and the first electrode of the driving transistor Td, respectively. The first power line VDD may be a high level power line, and the second power line VSS may be a low level power line.

In a data writing stage, the gate line Gate is loaded with an effective level signal. In this case, the data writing transistor T1' is turned on, and the driving transistor Td is turned off, thereby writing a data voltage of the data line Data into the third capacitor C3. In a light emitting stage, the gate line Gate is loaded with an ineffective level signal, and in this case, since the third capacitor C3 stores the data voltage, the driving transistor Td is turned on and a driving current is output to the light emitting device 22 based on a voltage difference between the gate electrode and the first electrode of the driving transistor Td.

It should be noted that, the pixel driving circuit 21 may alternatively be a circuit having other structures (e.g., 7T1C, 9T1C, etc.), and is not limited thereto.

In the embodiments of the present disclosure, active layers of respective transistors of the pixel driving circuit 21 are provided in the semiconductor layer, the gate electrodes of the respective transistors are provided in the first gate metal layer, a second plate of the third capacitor C3 is provided in the second gate metal layer, and the first power line VDD is provided in the first source-drain metal layer, and the data line Data is provided in the second source-drain metal layer. The pixel structure in the embodiments of the present disclosure is described below with reference to the drawings.

Figure 12A:
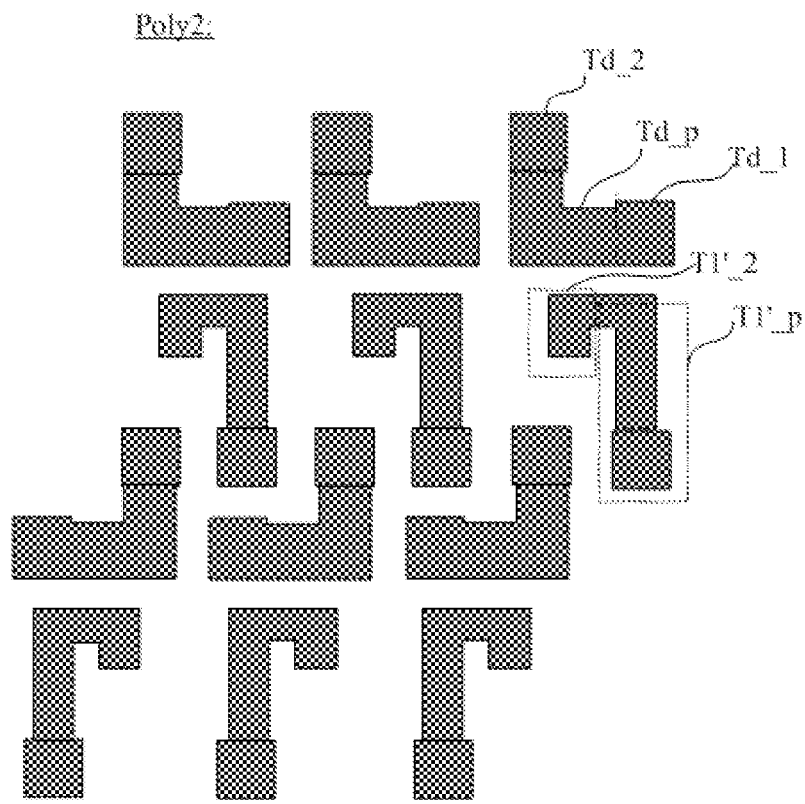
FIG. 12a is a plan view illustrating a semiconductor layer of a display substrate in some embodiments of the present disclosure.

FIG. 12a is a plan view illustrating a semiconductor layer of a display substrate in some embodiments of the present disclosure, and FIG. 12a illustrates a semiconductor layer poly2 of pixel structures of two rows and three columns. As shown in FIG. 12a, the semiconductor layer poly2 of the pixel structures includes the active layers of the respective transistors. Optionally, a material of the semiconductor layer poly2 may be polysilicon or metal oxide, which is not specifically limited in the embodiments of the present disclosure.

Optionally, a first electrode Td_1 and a second electrode Td_2 of the driving transistor Td are provided in the same layer as an active layer Td_p of the driving transistor Td; a second electrode T1'_2 of the data writing transistor T1' is provided in the same layer as an active layer T1'_p of the data writing transistor T1'; and the first electrode Td_1, the second electrode Td_2, and active layer Td_p of the driving transistor Td, and the second electrode T1'_2 and the active layer T1'_p of the data writing transistor T1' each are in the semiconductor layer poly 2. The first electrode Td_1 and the second electrode Td_2 of the driving transistor Td, and the second electrode T1'_2 of the data writing transistor T1' may be formed by performing ion doping on the semiconductor layer poly 2.

Figure 12B:
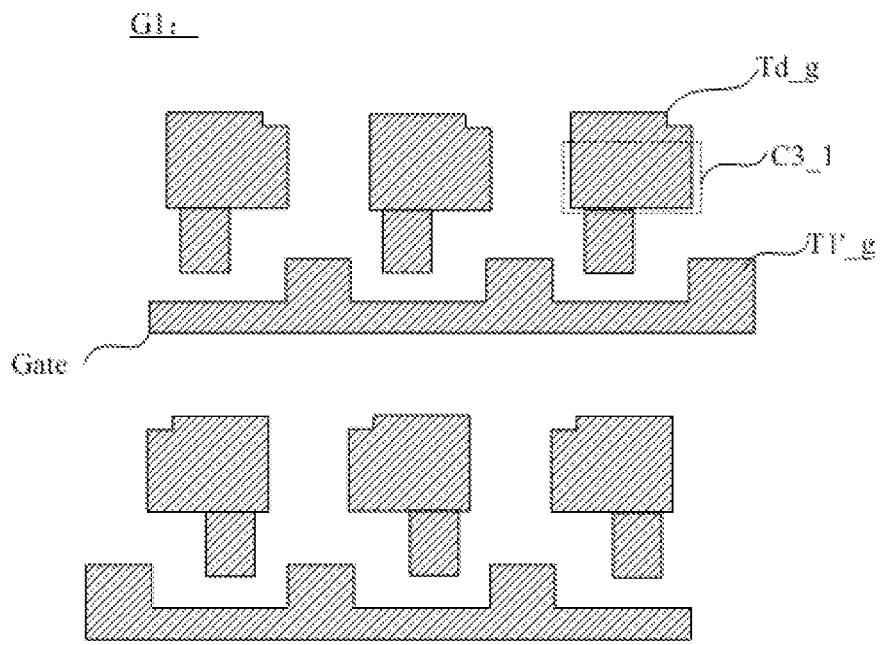
FIG. 12b is a plan view illustrating a first gate metal layer of a display substrate in some embodiments of the present disclosure.
Figure 12C:
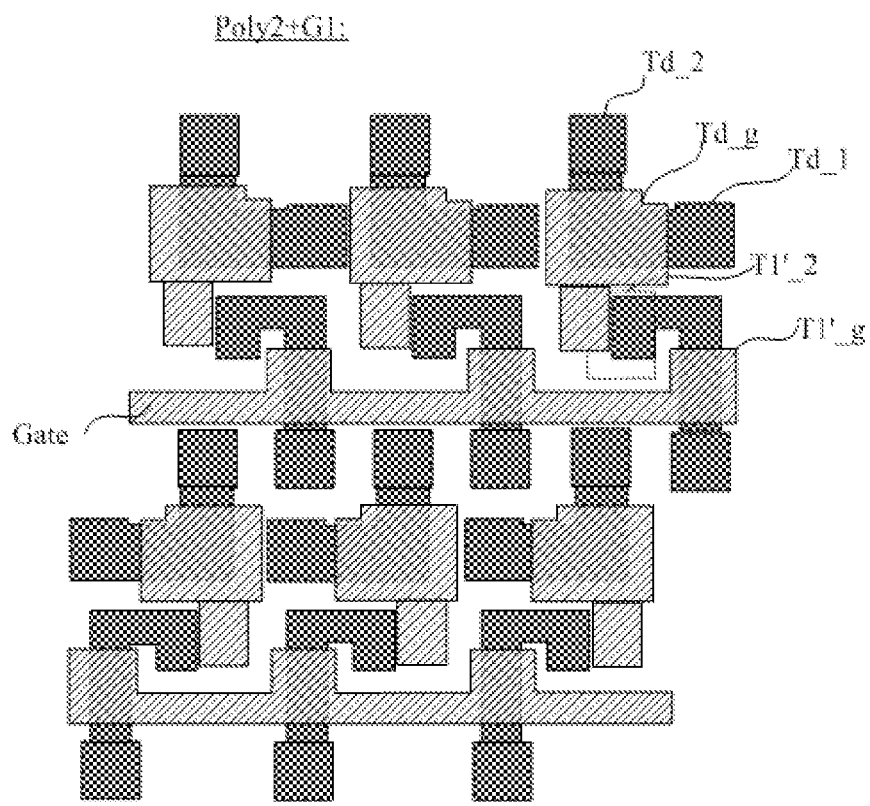
FIG. 12c is a plan view illustrating a semiconductor layer and a first gate metal layer of a display substrate in some embodiments of the present disclosure.

FIG. 12b is a plan view illustrating a first gate metal layer of a display substrate in some embodiments of the present disclosure, and FIG. 12c is a plan view illustrating a semiconductor layer and a first gate metal layer of a display substrate in some embodiments of the present disclosure. As shown in FIG. 12b and FIG. 12c, the first gate metal layer G1 includes a gate electrode T1'_g of the data writing transistor T1' and a gate electrode Td_g of the driving transistor Td. A first plate C3_1 of the third capacitor C3 is at least a part of the gate electrode Td_g of the driving transistor Td, so as to simplify the overall structure of the pixel driving circuit 21 and simplify the manufacturing process.

A first gate insulating layer is provided between the semiconductor layer poly2 and the first gate metal layer G1, and the first gate metal layer G1 is located on a side of the first gate insulating layer away from the semiconductor layer poly2. Optionally, the first gate insulating layer may be a single layer or a plurality of layers selected from a silicon nitride layer, a silicon oxide layer, and a silicon oxynitride layer.

Figure 12D:
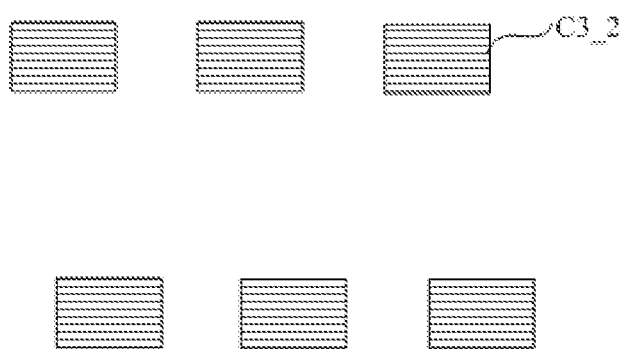
FIG. 12d is a plan view illustrating a second gate metal layer of a display substrate in some embodiments of the present disclosure.
Figure 12E:
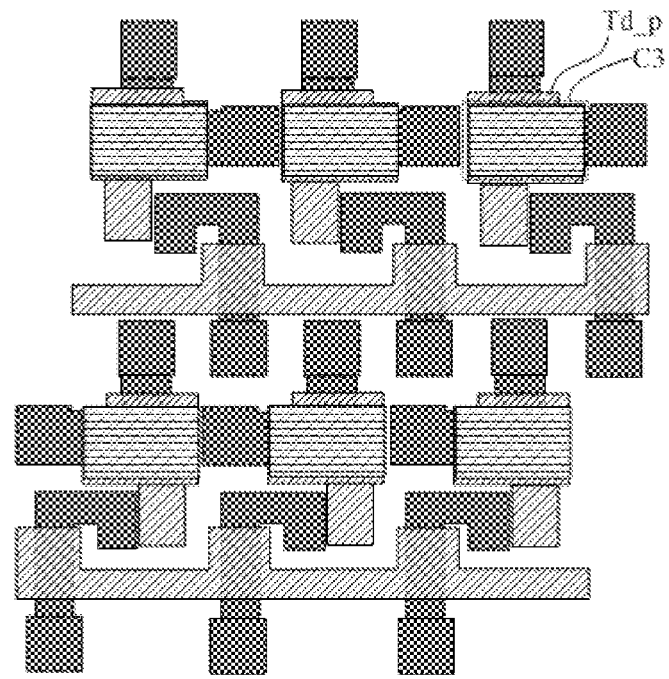
FIG. 12e is a plan view illustrating a semiconductor layer, a first gate metal layer, and a second gate metal layer of a display substrate in some embodiments of the present disclosure.

FIG. 12d is a plan view illustrating a second gate metal layer of a display substrate in some embodiments of the present disclosure, and FIG. 12e is a plan view illustrating a semiconductor layer, a first gate metal layer, and a second gate metal layer of a display substrate in some embodiments of the present disclosure. As shown in FIG. 12d and FIG. 12e, the second gate metal layer G2 is located on a side of the first gate metal layer G1 away from the second base 20, and a second gate insulating layer is provided between the second gate metal layer G2 and the first gate metal layer G1. A second plate C3_2 of each third capacitor C3 is located in the second gate metal layer G2. Optionally, the first gate metal layer G1 and the second gate metal layer G2 may be made of a metal material such as silver, aluminum, molybdenum, or copper, which is not specifically limited in the embodiments of the present disclosure.

An interlayer dielectric layer is provided on a side of the second gate metal layer G2 away from the second base 20. Optionally, the interlayer dielectric layer may be a single layer or a plurality of layers selected from a silicon nitride layer, a silicon oxide layer, and a silicon oxynitride layer.

Figure 12F:
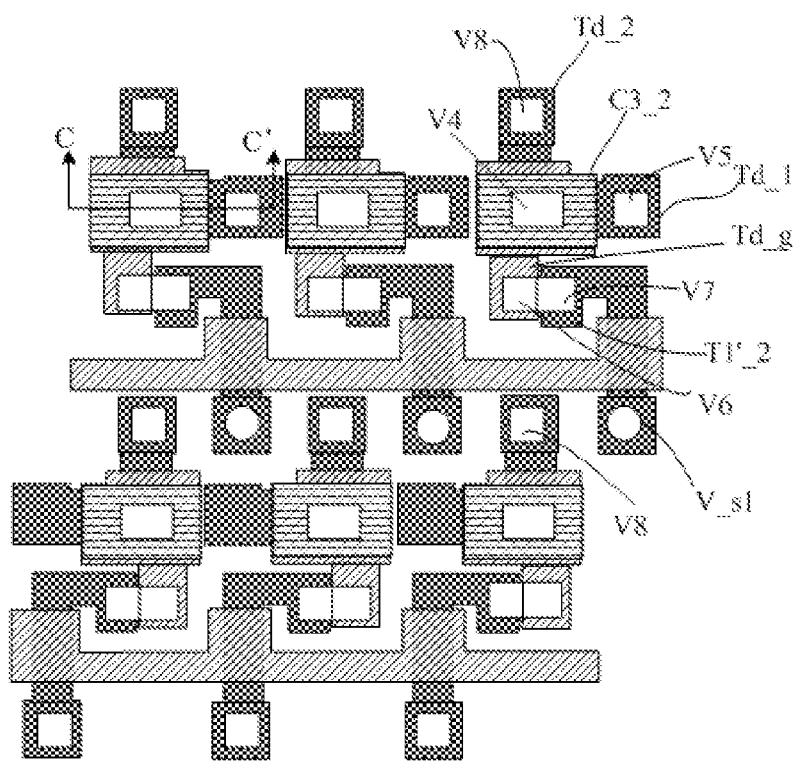
FIG. 12f is a schematic diagram illustrating via holes in an interlayer dielectric layer in some embodiments of the present disclosure.
Figure 12G:
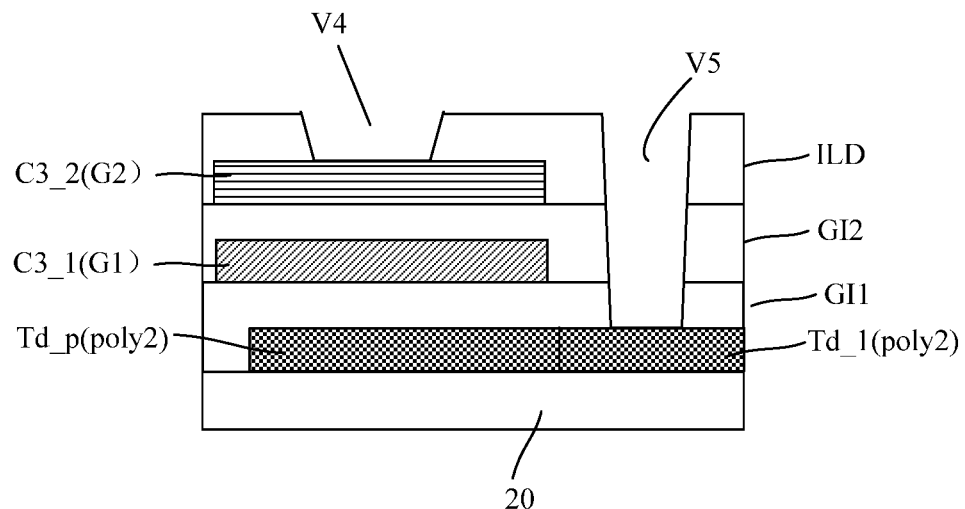
FIG. 12g is a cross-sectional view taken along a line C-C' of FIG. 12f.

FIG. 12f is a schematic diagram illustrating via holes in an interlayer dielectric layer in some embodiments of the present disclosure, and FIG. 12g is a cross-sectional view taken along a line C-C' of FIG. 12f. As shown in FIG. 12f and FIG. 12g, the interlayer dielectric layer ILD is provided with fourth via holes V4, fifth via holes V5, sixth via holes V6, seventh via holes V7, eighth via holes V8, and source via holes V sl. The second electrode T1'_2 of the data writing transistor T1' is connected to the data line through a corresponding source via hole V sl. Each fourth via hole V4 penetrates through the interlayer dielectric ILD and exposes a part of the second plate C3_2 of the corresponding third capacitor C3. Each fifth via hole V5 penetrates through the interlayer dielectric layer ILD, the second gate insulating layer GI2 and the first gate insulating layer GI1, and exposes a part of the first electrode Td_1 of the corresponding driving transistor Td. Each sixth via hole V6 penetrates through the interlayer dielectric layer ILD and the second gate insulating layer GI2, and exposes a part of the gate electrode Td_g of the corresponding driving transistor Td. An orthographic projection of each sixth via hole V6 on the second base 20 does not overlap with an orthographic projection of the second plate C3_2 of the corresponding third capacitor C3 on the second base 20. Each seventh via hole V7 penetrates through the interlayer dielectric layer ILD, the second gate insulating layer GI2 and the first gate insulating layer GI1, and exposes a part of the second electrode T1'_2 of the corresponding data writing transistor T1'. Each eighth via hole V8 penetrates through the interlayer dielectric layer ILD, the second gate insulating layer GI2 and the first gate insulating layer GI1, and exposes a part of the second electrode Td_2 of the corresponding driving transistor Td.

Figure 12H:
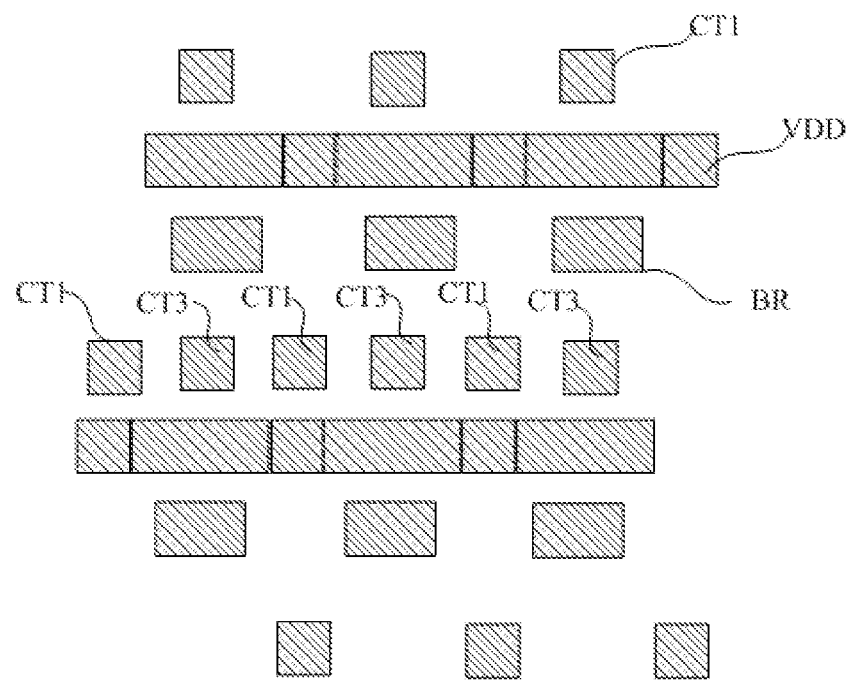
FIG. 12h is a plan view illustrating a first source-drain metal layer in some embodiments of the present disclosure.
Figure 12I:
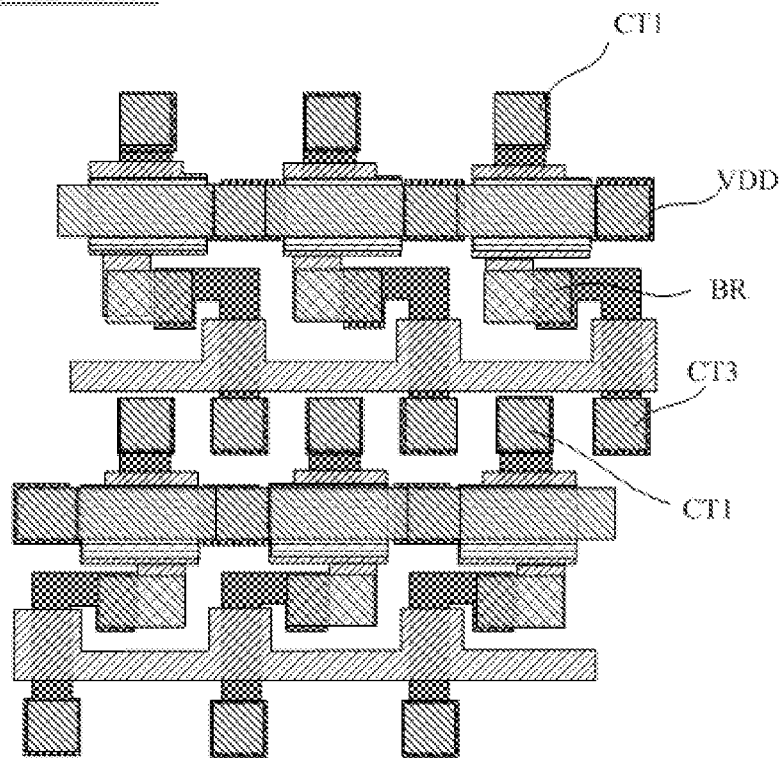
FIG. 12i is a plan view illustrating a semiconductor layer, a first gate metal layer, a second gate metal layer, and a first source-drain metal layer of a display substrate in some embodiments of the present disclosure.

FIG. 12h is a plan view illustrating a first source-drain metal layer in some embodiments of the present disclosure, and FIG. 12i is a plan view illustrating a semiconductor layer, a first gate metal layer, a second gate metal layer, and a first source-drain metal layer of a display substrate in some embodiments of the present disclosure. As shown in FIG. 12e to FIG. 12i, the first source-drain metal layer SD1 is located on a side of the second gate metal layer G2 away from the second base 20, and the interlayer dielectric ILD is provided between the first source-drain metal layer SD1 and the second gate metal layer G2. The first source-drain metal layer SD1 includes first power lines VDD, and each first power line VDD is connected to the second plates C3_2 of the corresponding third capacitors C3 through the corresponding fourth via holes V4 and is connected to the first electrodes Td_1 of the corresponding driving transistors Td through the corresponding fifth via holes V5.

In addition, the pixel structure further includes bridges BR provided in the same layer as the first power lines VDD, and the bridges BR and the first power lines VDD each are in the first source-drain metal layer SD1. One terminal of each bridge BR is connected to the gate electrode Td_g of the corresponding driving transistor Td through the corresponding sixth via hole V6, and the other terminal of each bridge BR is connected to the second electrode T1'_2 of the corresponding data writing transistor T1' through the corresponding seventh via hole V7. Optionally, each sixth via hole V6 communicates with the corresponding seventh via hole V7, to enhance the stability of the connection of each bridge BR with the gate electrode Td_g of the corresponding driving transistor Td and with the second electrode T1'_2 of the corresponding data writing transistor T1'.

In addition, the pixel structure further includes first adapters CT1 and third adapters CT3. The first adapters CT1 and the third adapters CT3 are provided in the same layer as the bridges BR, and both the first adapters CT1 and the third adapters CT3 are located in the first source-drain metal layer SD1. Each first adapter CT1 is connected to the second electrode Td_2 of the corresponding driving transistor Td through the corresponding eighth via hole V8. Each third adapter CT3 is connected to the first electrode of the corresponding data writing transistor T1' through the corresponding source via hole V sl.

Figure 12J:
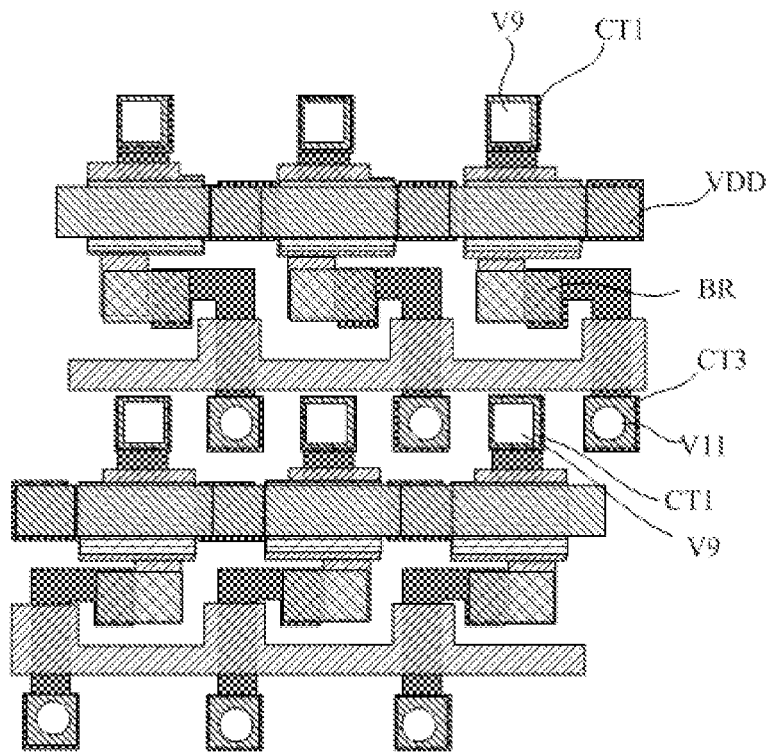
FIG. 12j is a schematic diagram illustrating via holes in a passivation layer in some embodiments of the present disclosure.

A passivation layer is provided on a side of the first source-drain metal layer SD1 away from the second base 20. Optionally, the passivation layer may be a single layer or a plurality of layers selected from a silicon nitride layer, a silicon oxide layer, and a silicon oxynitride layer. FIG. 12j is a schematic diagram illustrating via holes in a passivation layer in some embodiments of the present disclosure. As shown in FIG. 12j, ninth via holes V9 and eleventh via holes V11 are provided in the passivation layer. Each ninth via hole V9 exposes a part of the corresponding first adapter CT1, and each eleventh via hole V11 exposes a part of the corresponding third adapter CT 3.

Figure 12K:
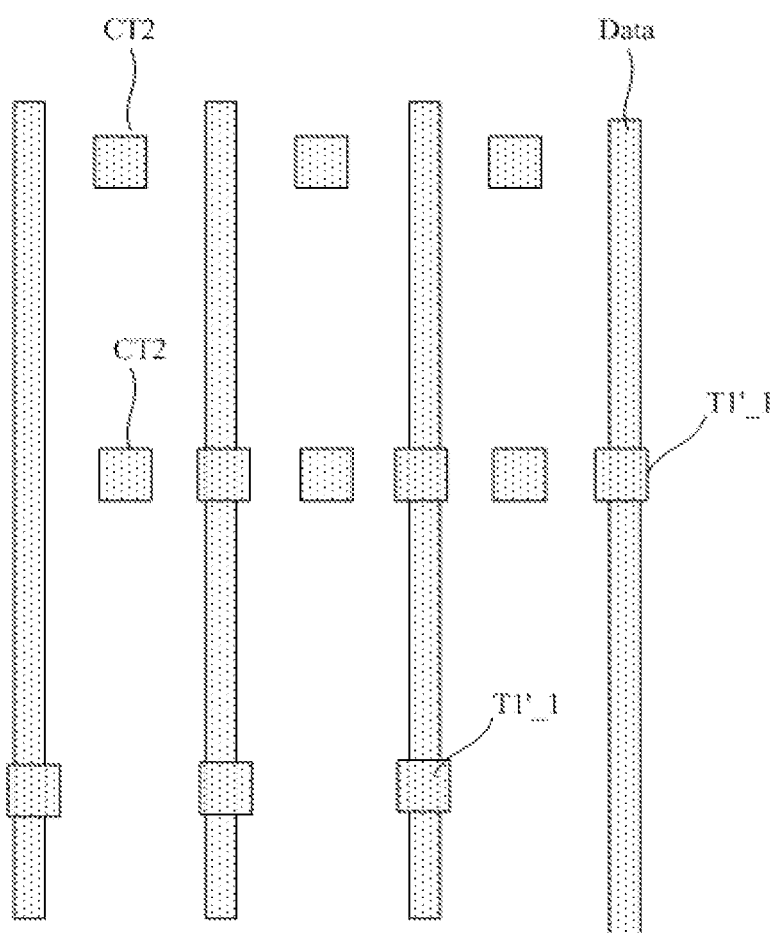
FIG. 12k is a plan view illustrating a second source-drain metal layer of a display substrate in some embodiments of the present disclosure.
Figure 13A:
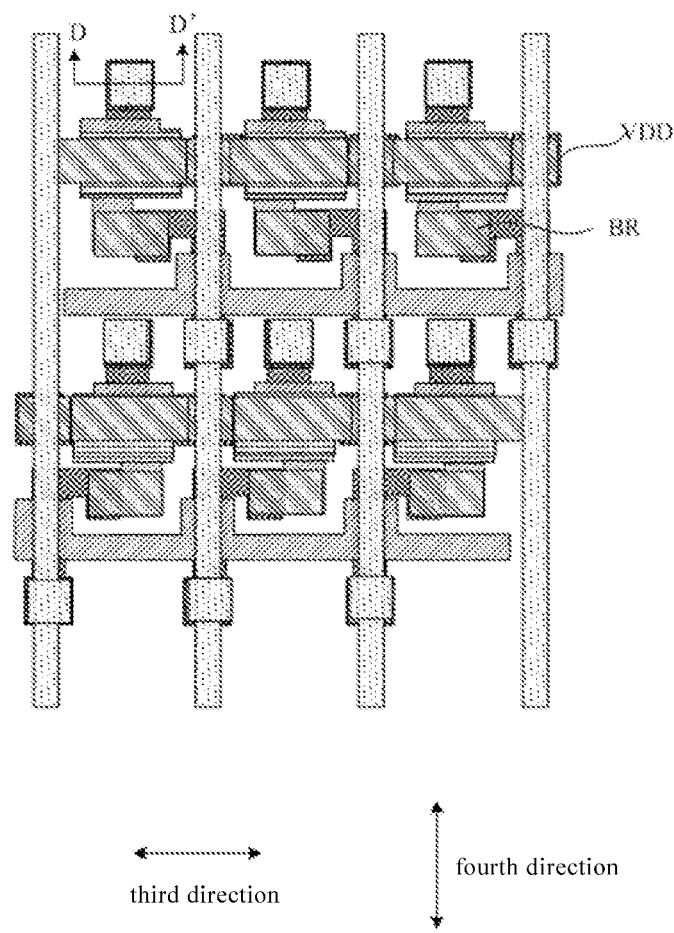
FIG. 13a is a plan view illustrating a semiconductor layer, a first gate metal layer, a second gate metal layer, a first source-drain metal layer, and a second source-drain metal layer of a display substrate in some embodiments of the present disclosure.
Figure 13B:
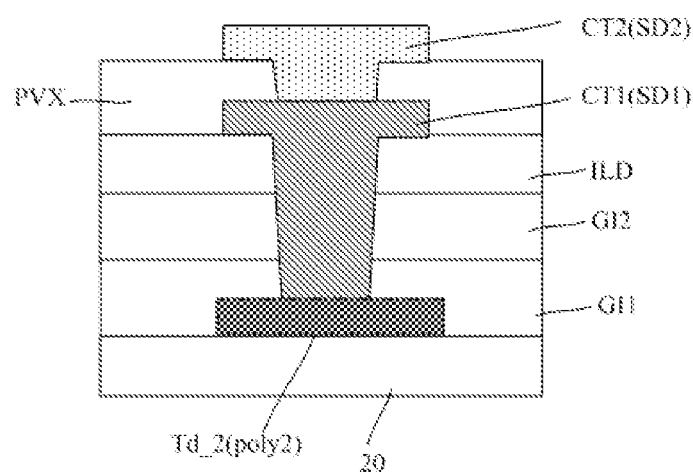

FIG. 12k is a plan view illustrating a second source-drain metal layer of a display substrate in some embodiments of the present disclosure, FIG. 13a is a plan view illustrating a semiconductor layer, a first gate metal layer, a second gate metal layer, a first source-drain metal layer, and a second source-drain metal layer of a display substrate in some embodiments of the present disclosure, and FIG. 13b is a cross-sectional view taken along a line D-D' of FIG. 13a. As shown in FIG. 12j to FIG. 13b, the second source-drain metal layer SD2 is located on a side of the first source-drain metal layer SD1 away from the second base 20, and the passivation layer PVX is provided between the second source-drain metal layer SD2 and the first source-drain metal layer SD1. The second source-drain metal layer SD2 includes data lines Data and second adapters CT2. Each second adapter CT2 is connected to the corresponding first adapter CT1 through the corresponding ninth via hole V9 in the passivation layer PVX. The first electrode T1'_1 of the each data writing transistor T1' and the corresponding data line Data are formed as an unitary structure, which is connected to the corresponding third adapter CT3 through the corresponding eleventh via hole V11, and thus, connected to the active layer of the corresponding data writing transistor T1' via the corresponding third adapter CT3. Optionally, the first source-drain metal layer SD1 and the second source-drain metal layer SD2 may be made of a metal material, such as silver, aluminum, molybdenum, or copper.

Optionally, the gate lines Gate and the first power lines VDD extend in a third direction, and the data lines Data extend in a fourth direction, and the third direction intersects with the fourth direction, for example, the third direction is perpendicular to the fourth direction. Optionally, the third direction is the same as the first direction, and the fourth direction is the same as the second direction.

For example, the plurality of pixel structures of the display substrate 2 are arranged in multiple rows and multiple columns, and the fourth direction is a column direction. Optionally, the data writing transistors T1' of two adjacent pixel driving circuits 21 in the same column are respectively connected to two adjacent data lines Data.

In some embodiments, a virtual structure obtained after a pixel driving circuit 21 in the i-th row and j-th column is moved in the column direction is in mirror symmetry with a pixel driving circuit 21 in the (i+1)-th row and (j+2)-th column, where $1 \le i \le m-1$, $1 \le j \le n-2$, m is the total number of rows of the pixel driving circuits 21, and n is the total number of columns of the pixel driving circuits 21. A virtual structure obtained after a pixel driving circuit 21 in the i-th row and j-th column is moved in the column direction is in mirror symmetry with a pixel driving circuit 21 in the (i+1)-th row and (j+2)-th column, where $1 \le i \le m-1$, $1 \le j \le n-2$, m is the total number of rows of the pixel driving circuits 21, and n is the total number of columns of the pixel driving circuits 21. The pixel driving circuit 21 in the i-th row and j-th column and the pixel driving circuit 21 in the (i+1)-th row and (j+2)-th column are respectively connected to two adjacent data lines Data.

Figure 13C:
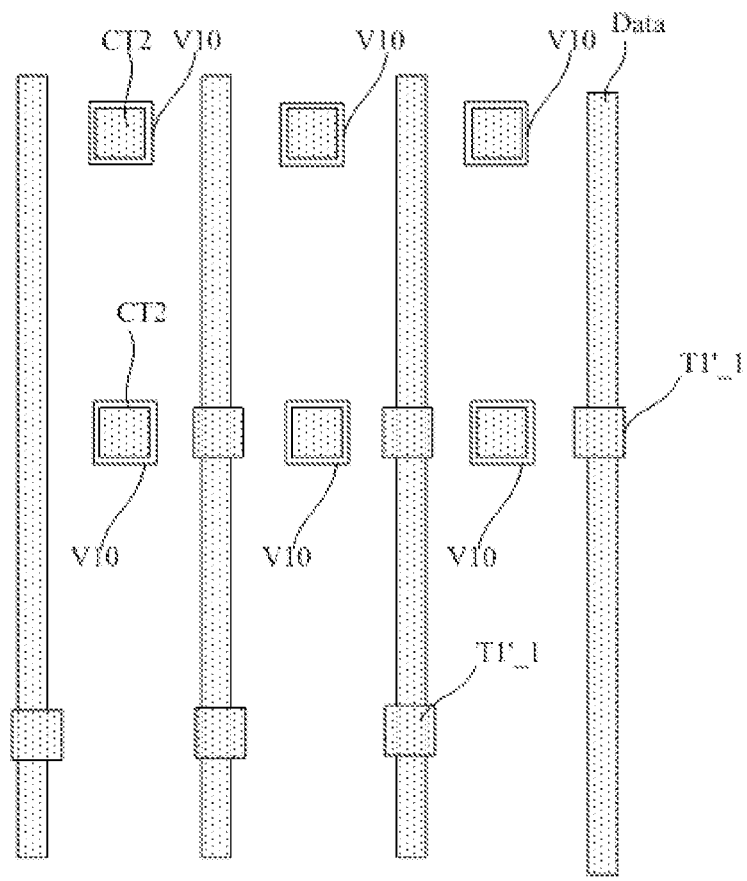
FIG. 13c is a diagram illustrating a positional relationship between tenth via holes and a second source-drain metal layer in some embodiments of the present disclosure.

A planarization layer is provided on a side of the second source-drain metal layer SD2 away from the second base 20, and tenth via holes are provided in the planarization layer. FIG. 13c is a diagram illustrating a positional relationship between tenth via holes and a second source-drain metal layer in some embodiments of the present disclosure. As shown in FIG. 13c, each tenth via hole V10 exposes at least a part of the corresponding second adapter CT2.

Figure 13D:
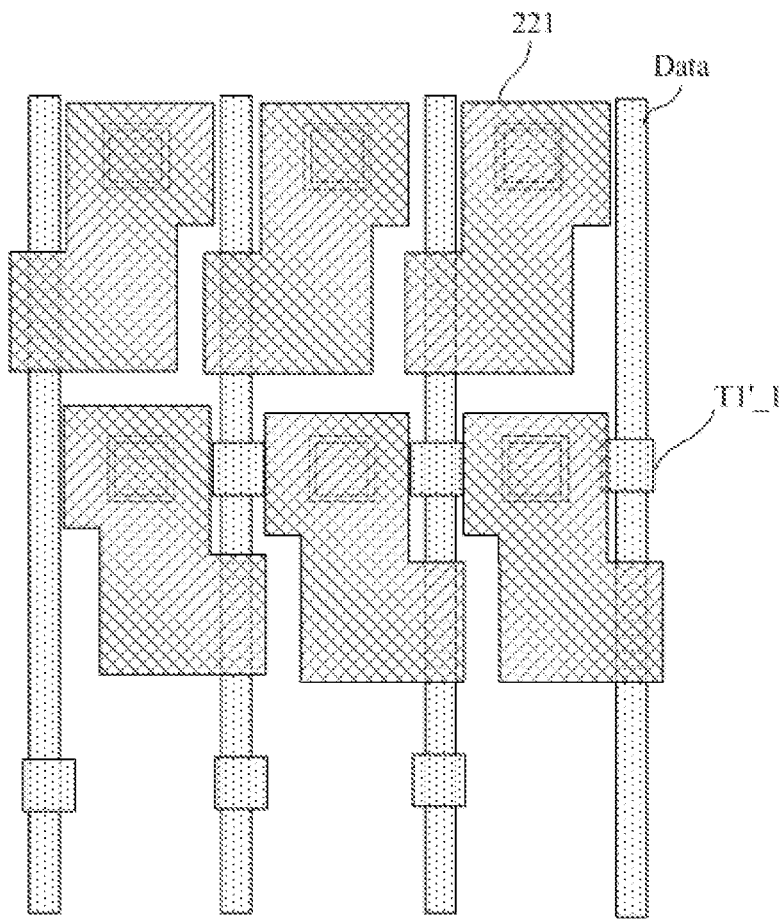
FIG. 13d is a plan view illustrating a first electrode layer and a second source-drain metal layer of a display substrate in some embodiments of the present disclosure.
Figure 13E:
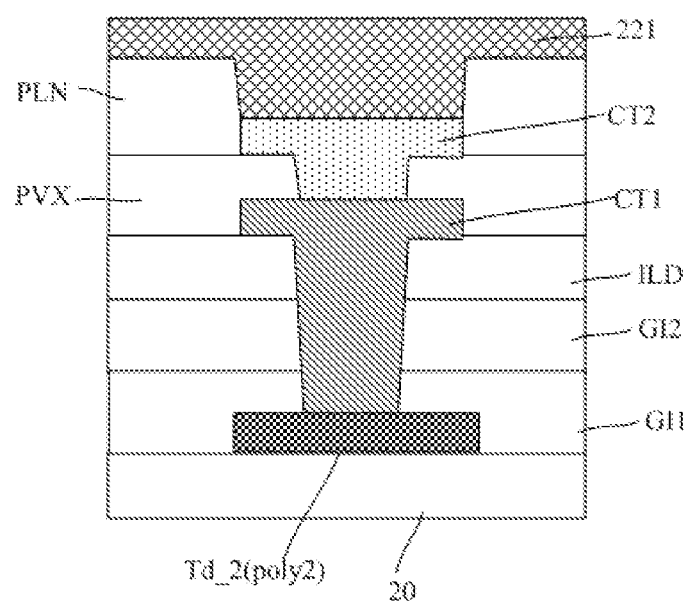
FIG. 13e is a schematic diagram illustrating a connection between a first electrode layer and a second source-drain metal layer of a display substrate in some embodiments of the present disclosure.

A layer, in which the first electrode 221 of the light emitting device 22 is located, is on a side of the second source-drain metal layer SD2 away from the second base 20, and the planarization layer is provided between the layer in which the first electrode of the light emitting device 22 is located and the second source-drain metal layer SD2. FIG. 13d is a plan view illustrating a first electrode layer and a second source-drain metal layer of a display substrate in some embodiments of the present disclosure, and FIG. 13e is a schematic diagram illustrating a connection between a first electrode layer and a second source-drain metal layer of the display substrate in some embodiments of the present disclosure. As shown in FIG. 13d and FIG. 13e, the first electrode layer includes first electrodes 221 of a plurality of light emitting devices 22. Each first electrode 221 is connected to the corresponding second adapter CT2 through the corresponding tenth via hole V10 penetrating through the planarization layer PLN, and thus, connected to the second electrode Td_2 of the corresponding driving transistor Td via the corresponding second adapter CT2 and the corresponding first adapter CT1.

Of course, the second adapters CT2 and the first adapters CT1 may not be provided, and each first electrode 221 is connected to the corresponding driving transistor Td through a via hole penetrating through the planarization layer PLN, the passivation layer PVX, the interlayer dielectric layer ILD, the second gate insulating layer GI2 and the first gate insulating layer GI1. By providing the second adapters CT2 and the first adapters CT1, it is not necessary to form a deep via hole directly, thereby ensuring the connection reliability between each first electrode 221 and the corresponding driving transistor Td.

Optionally, an orthographic projection of the first electrode 221 of each light emitting device 22 on the second base 20 overlaps with an orthographic projection of the corresponding data line Data on the second base 20, such that the light emitting area of the light emitting device 22 is increased as much as possible under the condition that the resolution of the display substrate 2 is constant.

Optionally, a pixel defining layer may be further provided on a side of the first electrode 221 away from the second base 20, and the pixel defining layer is provided with pixel openings therein in one-to-one correspondence with the first electrodes 221. Film layers of each light emitting device 22, such as the hole injection layer, the hole transport layer, the light emitting layer, the electron transport layer, the electron injection layer, and the like, are provided in a corresponding pixel opening. An orthographic projection of the pixel opening on the second base 20 may overlap with an orthographic projection of the corresponding data line Data on the second base 20.

The region of the first electrode 221 exposed from the pixel opening may be a light emitting region of the light emitting device 22. To ensure that the photosensitive device 13 adequately receives light emitted by the light emitting device 22, in some embodiments, a gap between first electrodes 131 of adjacent photosensitive devices 13 is directly opposite to a gap between light emitting regions of adjacent light emitting devices 22.

Figure 14:
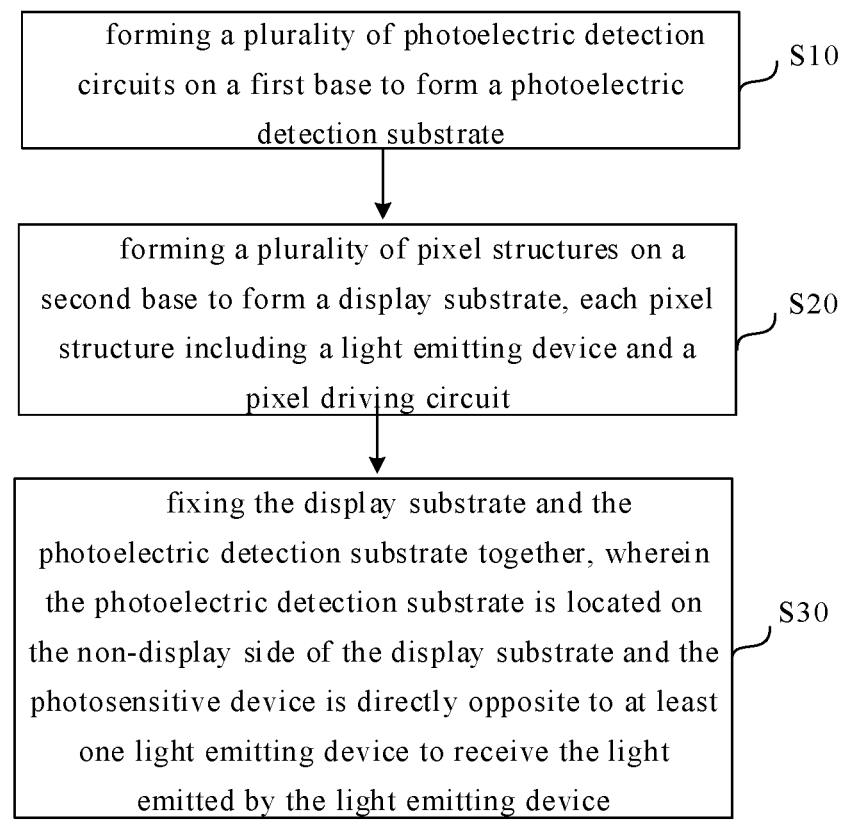
FIG. 14 is a flowchart illustrating a manufacturing method of a display apparatus in some embodiments of the present disclosure.

FIG. 14 is a flowchart illustrating a method of manufacturing a display apparatus in some embodiments of the present disclosure. As shown in FIG. 14, the manufacturing method includes:

In step S10, a plurality of photoelectric detection circuits are formed on a first base to form a photoelectric detection substrate. The photoelectric detection circuit is the photoelectric detection circuit described in the above embodiments.

For example, driving structures for photosensitive devices of the plurality of photoelectric detection circuits are formed on the first base. Each of the driving structures for the photosensitive devices includes the first reset transistor T1, the second reset transistor T2, the data read transistor T3, the first capacitor C1, and the second capacitor C2 in the above embodiments. The photosensitive devices of the plurality of photoelectric detection circuits are then formed.

In step S20, a plurality of pixel structures are formed on a second base to form a display substrate. Each of the plurality of pixel structures includes a light emitting device and a pixel driving circuit.

For example, pixel driving circuits for the plurality of pixel structures are formed on the second base, and then light emitting devices of the plurality of pixel structures are formed. Specific structures of the pixel driving circuit and the light emitting device are as described above. When a plurality of pixel driving circuits are formed, structures located in the same layer may be simultaneously formed. For example, the active layers of the transistors in the plurality of pixel driving circuits are simultaneously formed, the first plates of the third capacitors in the plurality of pixel driving circuits and gate lines are simultaneously formed, and the second plates of the third capacitors in the plurality of pixel driving circuits are simultaneously formed, and the like.

It should be noted that, in the embodiments of the present disclosure, the sequence of the step S10 and the step S20 is not limited; and the step S10 may be before the step S20, or may be after the step S20.

In step S30, the display substrate is fixed to the photoelectric detection substrate. The photoelectric detection substrate is located on the non-display side of the display substrate, and the photosensitive device is directly opposite to at least one light emitting device so as to receive the light emitted by the light emitting device.

For example, the display substrate may be bonded to the photoelectric detection substrate by an optical adhesive layer.

In some embodiments, the manufacturing method for a display apparatus further includes: forming a lens layer including a plurality of lenses for converging light. In this case, the step S30 may include: fixing the lens layer on the non-display side of the display substrate, and fixing the photoelectric detection substrate on a side of the lens layer away from the display substrate. For example, the lens layer is bonded to the non-display side of the display substrate by an optical adhesive layer, and the photoelectric detection substrate is bonded to the side of the lens layer away from the display substrate by an optical adhesive layer.

It will be understood that, the above embodiments are merely exemplary embodiments employed to illustrate the principle of the present disclosure, and the present disclosure is not limited thereto. It will be apparent to one of ordinary skill in the art that various changes and modifications can be made therein without departing from the spirit and scope of the present disclosure, and these changes and modifications are to be considered within the scope of the present disclosure.

What is claimed is:

1. A photoelectric detection circuit, comprising: a first reset sub-circuit, a second reset sub-circuit, a first storage sub-circuit, a data read sub-circuit and a photosensitive device, wherein
   a first terminal of the data read sub-circuit, a first terminal of the first storage sub-circuit, a first electrode of the photosensitive device and a first terminal of the first reset sub-circuit are connected to a first node; a second electrode of the photosensitive device is connected to a common voltage line;
   the photosensitive device is configured to generate an inductive electrical signal based on a sensed light signal;
   the data read sub-circuit is configured to transmit a voltage of the first node to a data read line in response to a signal of a scan line;
   the first reset sub-circuit is configured to reset the voltage of the first node in response to a signal of a reset line;
   the first storage sub-circuit is configured to store a voltage between the first node and the common voltage line; and
   the second reset sub-circuit is configured to reset a voltage of the scan line in response to the signal of the reset line.

2. The photoelectric detection circuit of claim 1, further comprising a second storage sub-circuit configured to store a voltage between the scan line and the common voltage line.

3. The photoelectric detection circuit of claim 1, wherein the first reset sub-circuit comprises a first reset transistor, and the first reset transistor has a gate electrode connected to the reset line, a first electrode connected to the common voltage line, and a second electrode forming the first terminal of the first reset sub-circuit; and the data read sub-circuit comprises a data read transistor, and the data read transistor has a gate electrode connected to the scan line, a first electrode connected to the data read line, and a second electrode forming the first terminal of the data read sub-circuit.

4. The photoelectric detection circuit of claim 3, wherein the data read line and the scan line are in different layers insulated from and spaced apart from each other, the scan line extends in a first direction, the data read line extends in a second direction, and the first direction intersects with the second direction; and the gate electrode of the data read transistor is a part of the scan line, and orthographic projections of the first electrode and the second electrode of the data read transistor on a first base are respectively on two sides, in the second direction, of an orthographic projection of the scan line on the first base.

5. The photoelectric detection circuit of claim 3, wherein the first electrode and the second electrode of the first reset transistor, and the first electrode and the second electrode of the data read transistor each are in the same layer as the data read line, and a first insulating layer is between a layer in which the first electrode of the first reset transistor is located and a layer in which the common voltage line is located, the first insulating layer is provided with a first via hole therein, a part of the common voltage line is exposed by the first via hole, and the first electrode of the first reset transistor is connected to the common voltage line through the first via hole;

wherein the second reset sub-circuit comprises a second reset transistor, and the second reset transistor has a gate electrode connected to the reset line, a first electrode having a one-piece structure together with the first electrode of the first reset transistor, and a second electrode connected to the scan line;

wherein the first insulating layer is further provided with a second via hole therein, a part of the scan line is exposed by the second via hole, and the second electrode of the second reset transistor is connected to the scan line through the second via hole.

6. The photoelectric detection circuit of claim 5, wherein the first storage sub-circuit comprises a first capacitor having a first plate and a second plate, and the first plate of the first capacitor and the common voltage line have a one-piece structure; and the second plate of the first capacitor, the second electrode of the data read transistor, and the second electrode of the first reset transistor have a one-piece structure;

the photosensitive device is on a side of the second plate of the first capacitor away from the first plate of the first capacitor, a second insulating layer is between a layer in which a first electrode of the photosensitive device is located and a layer in which the second plate of the first capacitor is located, the second insulating layer is provided with a third via hole therein, the third via hole exposes a part of the second plate of the first capacitor, the first electrode of the photosensitive device is connected to the second plate of the first capacitor through the third via hole to form the first node; and second electrodes of photosensitive devices of a plurality of photoelectric detection circuits have a one-piece structure.

7. The photoelectric detection circuit of claim 6, wherein an orthographic projection of the first electrode of the photosensitive device on a first base covers at least an orthographic projection of the first capacitor on the first base.

8. The photoelectric detection circuit of claim 5, wherein the second storage sub-circuit comprises a second capacitor, a first plate of the second capacitor is a part of the scan line, and a second plate of the second capacitor is a part of the first electrode of the first reset transistor.

9. A display apparatus, comprising:

a display substrate comprising: a second base and a plurality of pixel structures on the second base, each of the plurality of pixel structures comprising a light emitting device; and a photoelectric detection substrate comprising: a first base and a plurality of photoelectric detection circuits on the first base, wherein each of the plurality of photoelectric detection circuits is the photoelectric detection circuit of claim 1, wherein the display substrate comprises a display side and a non-display side opposite to each other, the photoelectric detection substrate is on the non-display side of the display substrate, an orthographic projection of each of the photosensitive devices on the second base is within an orthographic projection of y number of pixel structures on the second base, to receive light emitted by the light emitting device, where 1≤y≤100, and y is an integer.

10. The display apparatus of claim 9, wherein a material of the second base comprises glass or polyimide; and both an extending direction of the common voltage line and an extending direction of the reset line are the same as an extending direction of the scan line, and both the common voltage line and the reset line are in the same layer as the scan line, and the scan line is between the common voltage line and the reset line.

11. The display apparatus of claim 9, wherein each of the plurality of pixel structures further comprises a pixel driving circuit, and the pixel driving circuit comprises a driving transistor, a data writing transistor and a third capacitor;

the data writing transistor has a gate electrode connected to a gate line, a first electrode connected to a data line, and a second electrode connected to a gate electrode of the driving transistor;

the driving transistor has a first electrode connected to a first power line, and a second electrode connected to a first electrode of the light emitting device; and two terminals of the third capacitor are connected to the gate electrode and the first electrode of the driving transistor, respectively;

a first plate of the third capacitor is at least a part of the gate electrode of the driving transistor, and a second plate of the third capacitor is on a side of the first plate of the third electrode away from the second base;

an active layer, the first electrode and the second electrode of the driving transistor are in the same layer;

a first gate insulating layer is between a layer in which the gate electrode of the driving transistor is located and a layer in which the active layer of the driving transistor is located;

a second gate insulating layer is between the layer in which the gate electrode of the driving transistor is located and a layer in which the second plate of the third capacitor is located;

the first power line is on a side of the layer, in which the second plate of the third capacitor is located, away from the second base;

an interlayer dielectric layer is between a layer in which the first power line is located and the layer in which the second plate of the third capacitor is located; and the first power line is connected to the second plate of the third capacitor through a fourth via hole and is connected to the first electrode of the driving transistor through a fifth via hole, the fourth via hole penetrates through the interlayer dielectric layer and exposes a part of the second plate of the third capacitor; the fifth via hole penetrates through the interlayer dielectric layer, the second gate insulating layer and the first gate insulating layer, and exposes a part of the first electrode of the driving transistor;

the second electrode and an active layer of the data writing transistor are in the same layer as the active layer of the driving transistor, each of the plurality of pixel structures further comprises a bridge in the same layer as the first power line, one terminal of the bridge is connected to the gate electrode of the driving transistor through a sixth via hole, and the other terminal of the bridge is connected to the second electrode of the data writing transistor through a seventh via hole, and the sixth via hole penetrates through the interlayer dielectric layer and the second gate insulating layer, and exposes a part of the gate electrode of the driving transistor; the seventh via hole penetrates through the interlayer dielectric layer, the second gate insulating layer and the first gate insulating layer, and exposes a part of the second electrode of the data writing transistor; and the data line is on a side of the layer, in which the first power line is located, away from the second base;

a passivation layer is between a layer in which the data line is located and the layer in which the first power line is located;

the first electrode of the light emitting device is on a side of the layer, in which the data line is located, away from the second base, and a planarization layer is between a layer in which the first electrode of the light emitting device is located and the layer in which the data line is located;

each of the plurality of pixel structures further comprises:

a first adapter in the same layer as the bridge, wherein the first adapter is connected to the second electrode of the driving transistor through an eighth via hole, and the eighth via hole penetrates through the interlayer dielectric layer, the second gate insulating layer and the first gate insulating layer and exposes a part of the second electrode of the driving transistor; and a second adaptor in the same layer as the data line, wherein the second adaptor is connected to the first adaptor through a ninth via hole in the passivation layer, and the first electrode of the light emitting device is connected to the second adaptor through a tenth via hole penetrating through the planarization layer.

12. The display apparatus of claim 11, wherein an orthographic projection of the first electrode of the light emitting device on the second base overlaps with an orthographic projection of the data line on the second base.

13. The display apparatus of claim 11, wherein the plurality of pixel structures are arranged in multiple rows and multiple columns, and two adjacent pixel driving circuits in the same column are connected to two adjacent data lines, respectively; and pixel driving circuits in the same row are connected to the same first power line; and a virtual structure obtained after a pixel driving circuit in an i-th row and j-th column is moved in a column direction is in mirror symmetry with a pixel driving circuit in an (i+1)th row and (j+2)th column, where $1 \leq i \leq m-1$, $1 \leq j \leq n-2$, m is a total number of rows of the pixel driving circuits, and n is a total number of columns of the pixel driving circuits.

14. The display apparatus of claim 9, wherein the light emitting device further comprises a light emitting layer on a side of the first electrode of the light emitting device away from the second base, and each of the plurality of pixel structures further comprises a light passing portion between the light emitting layer and the second base, for passing light such that a part of light emitted by the light emitting layer is emitted toward the second base;

the light passing portion comprises a first light passing hole penetrating through the pixel driving circuit; or the light passing portion comprises a light passing slit in the pixel driving circuit; and the first electrode of the light emitting device is a reflective electrode, and the light passing portion further comprises a second light passing hole penetrating through the first electrode of the light emitting device.

15. The display apparatus of claim 9, further comprising:
a lens layer between the display substrate and the photoelectric detection substrate, the lens layer comprising a plurality of lenses for converging light.

16. The display apparatus of claim 9, further comprising:
a compensation circuit connected to the data read line and configured to determine a compensation parameter of the light emitting device based on a difference between an actual voltage and a theoretical voltage of the data read line; and a display driving circuit connected to the compensation circuit and the pixel structure, and configured to determine a driving signal for the light emitting device based on the compensation parameter of the light emitting device and a target brightness of the light emitting device and to output the driving signal to the pixel structure.

17. A driving method for a photoelectric detection circuit, the photoelectric detection circuit being the photoelectric detection circuit of claim 1, wherein the driving method comprises:

in a reset stage, loading an effective level signal to the reset line and an ineffective level signal to the scan line, such that the voltage of the first node is reset by the first reset sub-circuit and the voltage of the scan line is reset by the second reset sub-circuit;

in a charge accumulation stage, loading an ineffective level signal to the reset line and to the scan line, such that charge accumulation is performed by the photoelectric detection device;

in a read stage, loading an effective level signal to the scan line, such that the voltage of the first node is transmitted to a data read line; and in a redundancy stage, loading an ineffective level signal to the san line and to the reset line, such that the first node is disconnected from the data read line by the data read sub-circuit.

18. A manufacturing method for a display apparatus, comprising:

forming a plurality of photoelectric detection circuits on a first base to form a photoelectric detection substrate, wherein each of the plurality of photoelectric detection circuits is the photoelectric detection circuit of claim 1;

forming a plurality of pixel structures on a second base to form a display substrate, wherein the display substrate comprises a display side and a non-display side opposite to each other, and each of the plurality of pixel structures comprises a light emitting device; and fixing the display substrate and the photoelectric detection substrate together, wherein the photoelectric detection substrate is located on the non-display side of the display substrate, an orthographic projection of each of photosensitive devices on the second base is within an orthographic projection of y number of pixel structures on the second base to receive light emitted by the y number of light emitting devices, where $1 \leq y \leq 100$, and y is an integer.

19. The manufacturing method of claim 18, wherein the light emitting device comprises: a first electrode, a second electrode and a light emitting layer between the first electrode and the second electrode, the light emitting layer is located on a side of the first electrode of the light emitting device away from the second base; and each of the plurality of pixel structures further comprises a light passing portion between the light emitting layer and the second base, and the light passing portion is used for passing light, such that a part of light emitted by the light emitting layer is emitted to the second base;

the light passing portion comprises a first light passing hole penetrating through a pixel driving circuit; or the light passing portion comprises a light passing slit in the pixel driving circuit;

the first electrode of the light emitting device is a reflective electrode, and the light passing portion further comprises a second light passing hole penetrating through the first electrode of the light emitting device.

20. The manufacturing method of claim 18, further comprising: forming a lens layer comprising a plurality of lenses for converging light; and fixing the display substrate and the photoelectric detection substrate together comprising: fixing the lens layer on the non-display side of the display substrate, and fixing the photoelectric detection substrate on a side of the lens layer away from the display substrate.

* * * * *